United States Patent
Wei et al.

(10) Patent No.: US 11,626,607 B2
(45) Date of Patent: Apr. 11, 2023

(54) METHODS AND SYSTEMS FOR DETERMINING AVERAGE OXIDATION STATE OF REDOX FLOW BATTERY SYSTEMS

(71) Applicant: COUGAR CREEK TECHNOLOGIES, LLC, Kirkland, WA (US)

(72) Inventors: Kui Wei, Bellevue, WA (US); Liyu Li, Bellevue, WA (US)

(73) Assignee: COUGAR CREEK TECHNOLOGIES, LLC, Kirkland, WA (US)

(*) Notice: Subject to any disclaimer, the term of this patent is extended or adjusted under 35 U.S.C. 154(b) by 312 days.

(21) Appl. No.: 16/824,144

(22) Filed: Mar. 19, 2020

(65) Prior Publication Data
US 2020/0373594 A1 Nov. 26, 2020

Related U.S. Application Data

(60) Provisional application No. 62/849,959, filed on May 20, 2019.

(51) Int. Cl.
*H01M 8/18* (2006.01)
*H01M 8/0444* (2016.01)
(Continued)

(52) U.S. Cl.
CPC ............ *H01M 8/188* (2013.01); *C01G 31/00* (2013.01); *C22B 3/44* (2013.01); *G01R 31/392* (2019.01); *H01M 4/368* (2013.01); *H01M 4/38* (2013.01); *H01M 4/661* (2013.01); *H01M 8/04201* (2013.01); *H01M 8/04276* (2013.01); *H01M 8/04298* (2013.01); *H01M 8/04447* (2013.01); *H01M 8/04455* (2013.01); *H01M 8/04477* (2013.01); *H01M 8/04544* (2013.01);
(Continued)

(58) Field of Classification Search
None
See application file for complete search history.

(56) References Cited

U.S. PATENT DOCUMENTS

| | | | |
|---|---|---|---|
| 3,996,064 A | 12/1976 | Thaller | |
| 4,159,366 A | 6/1979 | Thaller | |

(Continued)

FOREIGN PATENT DOCUMENTS

| | | | |
|---|---|---|---|
| CN | 102460810 | | 5/2012 |
| CN | 105702997 A | | 6/2016 |

OTHER PUBLICATIONS

International Search Report and Written Opinion for PCT Application No. PCT/US2020/033376 dated Sep. 25, 2020.
(Continued)

*Primary Examiner* — Haroon S. Sheikh
(74) *Attorney, Agent, or Firm* — Branch Partners PLLC; Bruce E. Black

(57) ABSTRACT

A method for determining an average oxidation state (AOS) of a redox flow battery system includes measuring a charge capacity for a low potential charging period starting from a discharged state of the redox flow battery system to a turning point of a charge voltage; and determining the AOS using the measured charge capacity and volumes of anolyte and catholyte of the redox flow battery system. Other methods can be used to determine the AOS for a redox flow battery system or use discharge voltage instead of charging voltage.

20 Claims, 17 Drawing Sheets

(51) Int. Cl.
| | |
|---|---|
| *H01M 4/36* | (2006.01) |
| *H01M 4/38* | (2006.01) |
| *H01M 8/04082* | (2016.01) |
| *H01M 8/04276* | (2016.01) |
| *H01M 8/04537* | (2016.01) |
| *G01R 31/392* | (2019.01) |
| *C01G 31/00* | (2006.01) |
| *C22B 3/44* | (2006.01) |
| *H01M 4/66* | (2006.01) |
| *H01M 8/04298* | (2016.01) |
| *H01M 10/36* | (2010.01) |
| *H01M 10/42* | (2006.01) |

(52) U.S. Cl.
CPC .......... *H01M 10/36* (2013.01); *H01M 10/42* (2013.01); *H01M 2300/0005* (2013.01)

(56) References Cited

U.S. PATENT DOCUMENTS

| | | | |
|---|---|---|---|
| 4,192,910 | A | 3/1980 | Giner et al. |
| 4,270,984 | A | 6/1981 | Giner et al. |
| 4,454,649 | A | 6/1984 | Jalan et al. |
| 4,485,154 | A | 11/1984 | Remick et al. |
| 4,543,302 | A | 9/1985 | Gahn et al. |
| 4,576,878 | A | 3/1986 | Gahn |
| 4,732,827 | A | 3/1988 | Kaneko et al. |
| 4,786,567 | A | 11/1988 | Skyllas-Kazacos et al. |
| 4,814,241 | A | 3/1989 | Nagashima et al. |
| 4,874,483 | A | 10/1989 | Wakabayashi et al. |
| 4,882,241 | A | 11/1989 | Heinzel |
| 4,956,244 | A | 9/1990 | Shimizu et al. |
| 7,320,844 | B2 | 1/2008 | Skyllas-Kazacos |
| 7,820,312 | B2 | 10/2010 | Eickhoff |
| 7,855,005 | B2 | 12/2010 | Sahu |
| 7,919,204 | B2 | 4/2011 | Sahu |
| 7,927,731 | B2 | 4/2011 | Sahu |
| 7,976,974 | B2 | 7/2011 | Kazacos et al. |
| 8,230,736 | B2 | 7/2012 | Sahu et al. |
| 8,236,463 | B2 | 8/2012 | Sahu et al. |
| 8,264,202 | B2 | 9/2012 | Sahu et al. |
| 8,338,008 | B2 | 12/2012 | Zu et al. |
| 8,349,477 | B2 | 1/2013 | Parakulam et al. |
| 8,394,529 | B2 | 3/2013 | Keshavarz et al. |
| 8,535,821 | B2 | 9/2013 | Parakulam et al. |
| 8,541,121 | B2 | 9/2013 | Keshavarz et al. |
| 8,551,299 | B2 | 10/2013 | Keshavarz et al. |
| 8,587,150 | B2 | 11/2013 | Parakulam |
| 8,587,255 | B2 | 11/2013 | Parakulam et al. |
| 8,609,270 | B2 | 12/2013 | Xia et al. |
| 8,628,880 | B2 | 1/2014 | Li et al. |
| 8,771,856 | B2 | 7/2014 | Li et al. |
| 8,785,023 | B2 | 7/2014 | Horne et al. |
| 8,852,777 | B2 | 10/2014 | Keshavarz et al. |
| 8,877,365 | B2 | 11/2014 | Keshavarz et al. |
| 8,906,529 | B2 | 12/2014 | Horne et al. |
| 8,916,281 | B2 | 12/2014 | Chang et al. |
| 8,951,665 | B2 | 2/2015 | Keshavarz et al. |
| 8,980,454 | B2 | 3/2015 | Pham et al. |
| 8,980,484 | B2 | 3/2015 | Chang et al. |
| 8,993,183 | B2 | 3/2015 | Pham et al. |
| 9,077,011 | B2 | 7/2015 | Li et al. |
| 9,123,931 | B2 | 9/2015 | Li et al. |
| 9,130,218 | B2 | 9/2015 | Wang et al. |
| 9,153,832 | B2 | 10/2015 | Li et al. |
| 9,257,710 | B2 | 2/2016 | Keshavarz et al. |
| 9,368,824 | B2 | 6/2016 | Xia et al. |
| 9,722,264 | B2 | 8/2017 | Li et al. |
| 9,819,039 | B2 | 11/2017 | Li et al. |
| 9,846,116 | B2 | 12/2017 | Li et al. |
| 9,941,527 | B2 | 4/2018 | Li et al. |
| 9,960,443 | B2 | 5/2018 | Wang et al. |
| 10,044,058 | B2 | 8/2018 | Darling et al. |
| 10,135,087 | B2 | 11/2018 | Sun et al. |
| 10,333,159 | B2 | 6/2019 | Li et al. |
| 10,424,797 | B2 | 9/2019 | Zhang et al. |
| 2002/0108910 | A1 | 8/2002 | Lyon |
| 2008/0292964 | A1 | 11/2008 | Kazacos et al. |
| 2010/0003586 | A1 | 1/2010 | Sahu |
| 2010/0143781 | A1 | 6/2010 | Keshavarz et al. |
| 2011/0070483 | A1 | 3/2011 | Keshavarz et al. |
| 2011/0076526 | A1 | 3/2011 | Zu et al. |
| 2013/0084506 | A1 | 4/2013 | Chang et al. |
| 2013/0095362 | A1 | 4/2013 | Keshavarz et al. |
| 2014/0127542 | A1 | 5/2014 | Li et al. |
| 2014/0272483 | A1 | 9/2014 | Pham et al. |
| 2016/0006051 | A1 | 1/2016 | Winter et al. |
| 2016/0308234 | A1 | 10/2016 | Reece et al. |
| 2016/0315339 | A1 | 10/2016 | Darling et al. |
| 2017/0229728 | A1 | 8/2017 | Dong et al. |
| 2018/0102561 | A1 | 4/2018 | Sullivan |
| 2018/0277868 | A1 | 9/2018 | Loretz et al. |
| 2018/0316033 | A1 | 11/2018 | Evans |
| 2020/0006796 | A1 | 1/2020 | Su et al. |

OTHER PUBLICATIONS

Invitation to Pay Additional Fees and, where applicable, Protest Fee for PCT Application No. PCT/US2020/033376 mailed Jul. 16, 2020.
Official Communication for U.S. Appl. No. 16/824,119 dated May 19, 2020.
Official Communication for U.S. Appl. No. 16/824,195 dated May 19, 2020.
Johnson and Reid, "Chemical and Electrochemical Behavior of the Cr(III)/Cr(II) Half-Cell in the Iron-Chromium Redox Energy Storage System," J. Electrochem. Soc.: Electrochemical Science and Technology; vol. 132, No. 5; May 1985; pp. 1058-1062.
Norman H. Hagedorn, "NASA Redox Storage System Development Project," Final Report Prepared for U.S. Department of Energy Conservation and Renewable Energy Division of Energy Storage Systems, Oct. 1984, 46 pages.
Official Communication for U.S. Appl. No. 16/824,027 dated Jun. 8, 2021.
Official Communication for U.S. Appl. No. 16/824,159 dated Jun. 10, 2021.

METHODS AND SYSTEMS FOR DETERMINING AVERAGE OXIDATION STATE OF REDOX FLOW BATTERY SYSTEMS

RELATED PATENT APPLICATIONS

The present patent application claims the benefit of U.S. Provisional Patent Application Ser. No. 62/849,959, filed May 20, 2019, incorporated herein by reference in its entirety.

FIELD

The present invention is directed to the area of redox flow battery systems and methods of making and using redox flow battery systems. The present invention is also directed to methods and systems for determining average oxidation state of redox flow battery systems and rebalancing redox flow battery systems.

BACKGROUND

The cost of renewable power generation has reduced rapidly in the past decade and continues to decrease as more renewable power generation elements, such as solar panels, are deployed. However, renewable power sources, such as solar, hydroelectric, and wind sources, are often intermittent and the pattern of user load does not typically coincide with the intermittent nature of the sources. There is a need for an affordable and reliable energy storage system to store power generated by renewable power sources when available and to provide power to users when there is insufficient power generation from the renewable power sources.

BRIEF SUMMARY

One embodiment is a method for determining an average oxidation state (AOS) of a redox flow battery system. The method includes measuring a charge capacity for a low potential charging period starting from a discharged state of the redox flow battery system to a turning point of a charge voltage; and determining the AOS using the measured charge capacity and volumes of anolyte and catholyte of the redox flow battery system.

In at least some embodiments, the anolyte and the catholyte of the redox flow battery system both includes chromium ions and iron ions and determining the AOS further includes determining the AOS using initial concentrations of chromium ions and iron ions in the anolyte and catholyte. In at least some embodiments, a molar ratio of chromium in the anolyte to iron in the catholyte is at least 1.25. In at least some embodiments, the low potential charging period corresponds to a period of reduction of $Fe^{3+}$ in the anolyte.

In at least some embodiments, the method further includes rebalancing the AOS in response to the determination. In at least some embodiments, rebalancing the AOS includes oxidizing vanadium ions in a balancing electrolyte to dioxovanadium ions to produce hydrogen ions, wherein the anolyte or catholyte of the redox flow battery system form a balancing arrangement with the balancing electrolyte using at least two half-cells; and regenerating the vanadium ions by reducing the dioxovanadium ions using a reductant.

In at least some embodiments, the method further includes, prior to measuring the charge capacity, applying a potential to discharge the redox flow battery system. In at least some embodiments, measuring the charge capacity includes measuring the charge capacity in the anolyte within the redox flow battery system. In at least some embodiments, measuring the charge capacity includes measuring the charge capacity in a portion of the anolyte removed from the redox flow battery system.

Another embodiment is a method for determining an average oxidation state (AOS) of a redox flow battery system including a catholyte and an anolyte that both include iron and chromium ions. The method includes measuring in situ an amount or concentration of a first ionic species in a first one of either the catholyte or the anolyte; measuring in situ an amount or concentration of a second ionic species in a second one of either the catholyte or the anolyte; and determining the AOS using the measured amounts or concentrations, initial concentrations or amounts of iron and chromium in the catholyte and anolyte, and volumes of anolyte and catholyte of the redox flow battery system.

In at least some embodiments, a molar ratio of chromium in the anolyte to iron in the catholyte is at least 1.25. In at least some embodiments, the method further includes rebalancing the AOS in response to the determination. In at least some embodiments, rebalancing the AOS includes oxidizing vanadium ions in a balancing electrolyte to dioxovanadium ions to produce hydrogen ions, wherein the anolyte or catholyte of the redox flow battery system form a balancing arrangement with the balancing electrolyte using at least two half-cells; and regenerating the vanadium ions by reducing the dioxovanadium ions using a reductant.

In at least some embodiments, measuring in situ the amount or concentration of the first ionic species includes measuring the amount or concentration of the first ionic species with the first one of either the catholyte or the anolyte not flowing and another one of the catholyte or anolyte flowing. In at least some embodiments, measuring in situ the amount or concentration of the second ionic species comprises measuring the amount or concentration of the second ionic species with the second one of either the catholyte or the anolyte not flowing and another one of the catholyte or anolyte flowing.

In at least some embodiments, measuring in situ the amount or concentration of the first ionic species includes measuring the amount or concentration of the first ionic species by electrochemically titrating the first ionic species using vanadium ions in a balancing electrolyte.

Yet another embodiment is a method for determining an average oxidation state (AOS) of a redox flow battery system including a catholyte and an anolyte that both include iron and chromium ions. The method includes measuring a discharge rate during discharge of a redox flow battery system; determining a turning point of the discharge and measuring an open circuit voltage (OCV) after the turning point; estimating a concentration of $Fe^{3+}$ using the measured OCV; and determining the AOS using the measured concentration and volumes of anolyte and catholyte of the redox flow battery system.

In at least some embodiments, a molar ratio of chromium in the anolyte to iron in the catholyte is at least 1.25. In at least some embodiments, the method further includes rebalancing the AOS in response to the determination. In at least some embodiments, rebalancing the AOS includes oxidizing vanadium ions in a balancing electrolyte to dioxovanadium ions to produce hydrogen ions, wherein the anolyte or catholyte of the redox flow battery system form a balancing arrangement with the balancing electrolyte using at least two half-cells; and regenerating the vanadium ions by reducing the dioxovanadium ions using a reductant.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention is directed to the area of redox flow battery systems and methods of making and using redox flow battery systems. The present invention is also directed to iron-chromium (Fe—Cr) redox flow battery systems and methods of making an using Fe—Cr redox flow battery systems.

Redox flow battery systems are a promising technology for the storage of energy generated by renewable energy sources, such as solar, wind, and hydroelectric sources, as well as non-renewable and other energy sources. As described herein, in at least some embodiments, a redox flow battery system can have one or more of the following properties: long life; reusable energy storage; or tunable power and storage capacity. The terms "storage capacity", "energy capacity", and "charge capacity" are used interchangeably unless otherwise indicated.

Figure 1:
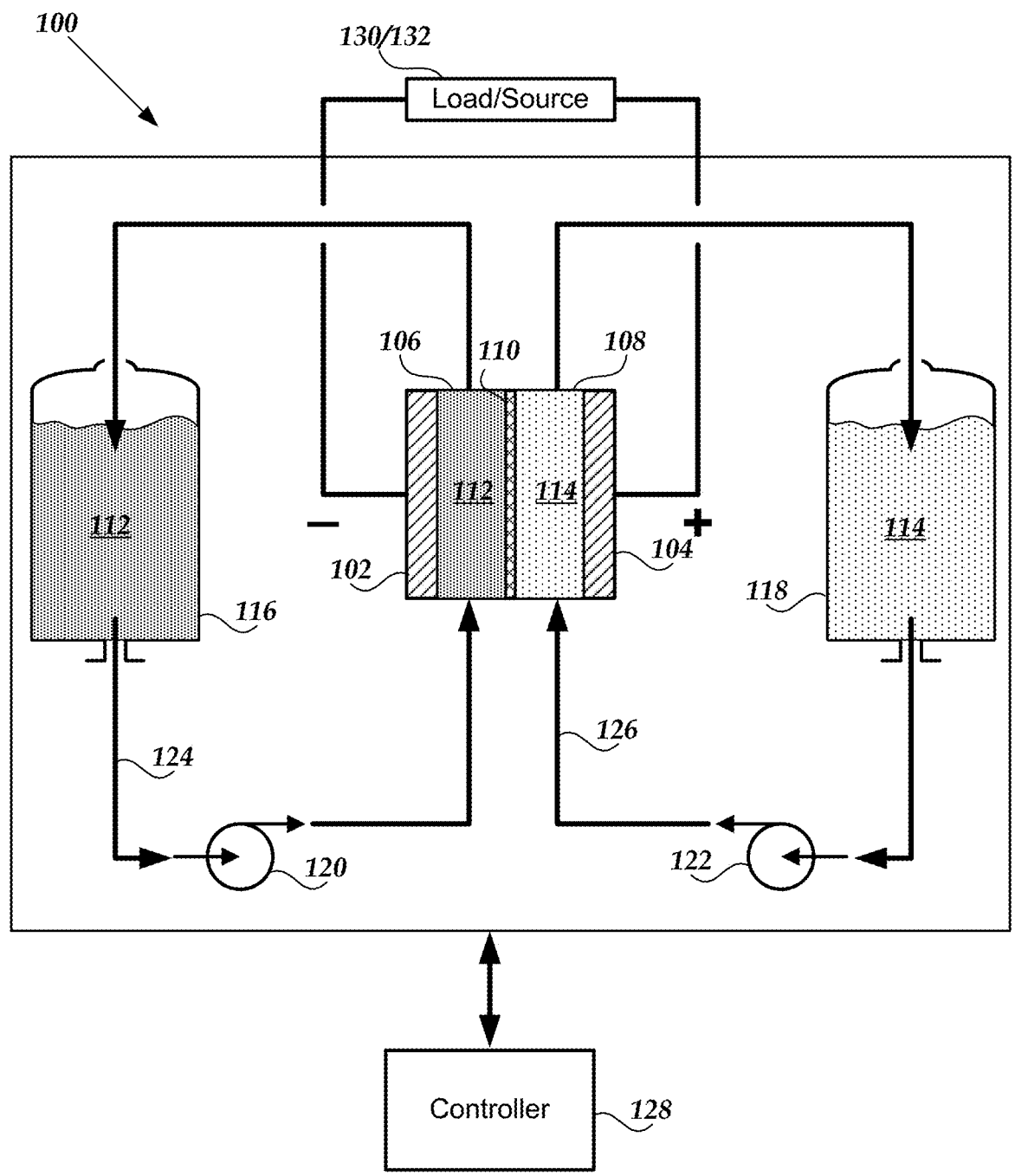
FIG. 1 is a schematic diagram of one embodiment of a redox flow battery system, according to the invention.

FIG. 1 illustrates one embodiment of a redox flow battery system 100. It will be recognized that other redox flow battery systems 100 may include more or fewer elements and the elements may be arranged differently than shown in the illustrated embodiments. It will also be recognized that the description below of components, methods, systems, and the like can be adapted to other redox flow battery systems different from the illustrated embodiments.

The redox flow battery system 100 of FIG. 1 includes two electrodes 102, 104 and associated half-cells 106, 108 that are separated by a separator 110. The electrodes 102, 104 can be in contact or separated from the separator. Electrolyte solutions flow through the half-cells 106, 108 and are referred to as the anolyte 112 and the catholyte 114. The redox flow battery system 100 further includes an anolyte tank 116, a catholyte tank 118, an anolyte pump 120, a catholyte pump 122, an anolyte distribution arrangement 124, and a catholyte distribution arrangement 126. The anolyte 112 is stored in the anolyte tank 116 and flows around the anolyte distribution arrangement 124 through, at least in part, action of the anolyte pump 120 to the half-cell 106. The catholyte 114 is stored in the catholyte tank 118 and flows around the catholyte distribution arrangement 126 through, at least in part, action of the catholyte pump 122 to the half-cell 108. It will be recognized that, although the illustrated embodiment of FIG. 1 includes a single one of each of the components, other embodiments can include more than one of any one or more of the illustrated components. For example, other embodiments can include multiple electrodes 102, multiple electrodes 104, multiple anolyte tanks 116, multiple catholyte tanks 118, multiple half-cells 112, or multiple half-cells 114, or any combination thereof.

The anolyte and the catholyte are electrolytes and can be the same electrolyte or can be different electrolytes. During energy flow into or out of the redox flow battery system 100, the electrolyte in one of the half-cells 106, 108 is oxidized and loses electrons and the electrolyte in the other one of the half-cells is reduced and gains electrons.

The redox flow battery system 100 can be attached to a load/source 130/132, as illustrated in FIG. 1. In a charge mode, the redox flow battery system 100 can be charged or recharged by attaching the flow battery to a source 132. The source 132 can be any power source including, but not limited to, fossil fuel power sources, nuclear power sources, other batteries or cells, and renewable power sources, such as wind, solar, or hydroelectric power sources. In a discharge mode, the redox flow battery system 100 can provide energy to a load 130. In the charge mode, the redox flow battery system 100 converts electrical energy from the source 132 into chemical potential energy. In the discharge mode, the redox flow battery system 100 converts the chemical potential energy back into electrical energy that is provided to the load 130.

The redox flow battery system 100 can also be coupled to a controller 128 that can control operation of the redox flow battery system. For example, the controller 128 may connect or disconnect the redox flow battery system 100 from the load 130 or source 132. The controller 128 may control operation of the anolyte pump 120 and catholyte pump 122. The controller 128 may control operation of valves associated with the anolyte tank 116, catholyte tank 118, anolyte distribution system 124, catholyte distribution system 126, or half-cells 106, 108. The controller 128 may be used to control general operation of the redox flow battery system 100 include switching between charge mode, discharge mode, and, optionally, a maintenance mode (or any other suitable modes of system operation.) In at least some embodiments, the controller or the redox flow battery system may control the temperature of within the half-cells or elsewhere in the system. In at least some embodiments, the temperature of the half-cells (or the system in general or portions of the system) is controlled to be no more than 65, 60, 55, or 50 degrees Celsius during operation.

Any suitable controller 128 can be used including, but not limited to, one or more computers, laptop computers, servers, any other computing devices, or the like or any combination thereof and may include components such as one or more processors, one or more memories, one or more input devices, one or more display devices, and the like. The controller 128 may be coupled to the redox flow battery system through any wired or wireless connection or any combination thereof. The controller 128 (or at least a portion of the controller) may be located local to the redox flow battery system 100 or located, partially or fully, non-locally with respect to the redox flow battery system.

The electrodes 102, 104 can be made of any suitable material including, but not limited to, graphite or other carbon materials (including solid, felt, paper, or cloth electrodes made of graphite or carbon), gold, titanium, lead, or the like. The two electrodes 102, 104 can be made of the same or different materials. In at least some embodiments, the redox flow battery system 100 does not include any homogenous or metallic catalysts for the redox reaction in the anolyte or catholyte or both. This may limit the type of material that may be used for the electrodes.

The separator 110 separates the two half-cells 106, 108. In at least some embodiments, the separator 110 allows the transport of selected ions (for example, $H^+$, $Cl^-$, or iron or chromium ions or any combination thereof) during the charging or discharging of the redox flow battery system 100. In some embodiments, the separator 110 is a microporous membrane. Any suitable separator 110 can be used and examples of suitable separator include, but are not limited to, ion transfer membranes, anionic transfer membranes, cationic transfer membranes, microporous separators, or the like or any combination thereof.

Redox flow battery systems can be safe, reliable, and provide a reusable energy storage medium. It has been challenging, however, to identify a redox flow battery system that has a desirable storage energy with a long life (e.g., a flow battery system that maintains its storage capacity for many charge/discharge cycles), and is made of materials that have abundant availability (e.g., materials that are abundant on Earth and are commercially mined and available in relatively large quantities). Current lithium and vanadium batteries utilize materials that have limited availability. The storage capacity of many conventional battery systems also degrades when subjected 10, 50, or 100 charge/discharge cycles or more. A further challenge for aqueous redox flow battery systems is to manage or avoid the evolution of hydrogen or oxygen from water.

As described herein, a suitable and useful redox flow battery system is an iron-chromium (Fe—Cr) redox flow battery system utilizing $Fe^{3+}/Fe^{2+}$ and $Cr^{3+}/Cr^{2+}$ redox chemistry. Iron and chromium are generally readily commercially available and, at least in some embodiments, the storage capacity of a Fe—Cr redox flow battery system does not degrade by more than 10% or 20% over at least 100, 200, 250, or 500 charge/discharge cycles or can be configured, using maintenance procedures, to maintain at least 70%, 80%, or 90% storage capacity over at least 100, 200, 250, or 500 charge/discharge cycles.

In at least some embodiments, the electrolytes (i.e., the catholyte or anolyte) of a Fe—Cr redox flow battery system include an iron-containing compound or a chromium-containing compound (or both) dissolved in a solvent. In some embodiments, the anolyte and catholyte contain both the iron-containing compound and the chromium-containing compound. The concentrations of these two compounds in the anolyte and catholyte can be the same or different. In other embodiments, the catholyte includes only the iron-containing compound and the anolyte includes only the chromium-containing compound.

The iron-containing compound can be, for example, iron chloride, iron sulfate, iron bromide, or the like or any combination thereof. The chromium-containing compound can be, for example, chromium chloride, chromium sulfate, chromium bromide, or the like or any combination thereof. The solvent can be water; an aqueous acid, such as, hydrochloric acid, hydrobromic acid, sulfuric acid, or the like. In at least some embodiments, both the catholyte and the anolyte of an Fe—Cr redox flow battery system includes iron chloride and chromium chloride dissolved in hydrochloric acid. In at least some embodiments, the catholyte of an Fe—Cr redox flow battery system includes iron chloride dissolved in hydrochloric acid and the anolyte includes chromium chloride dissolved in hydrochloric acid.

In at least some instances, it has been found that chloride-complexed chromium ions (for example, $Cr(H_2O)_5Cl^{2+/+}$) have faster reaction kinetics and lower $H_2$ production than at least some other chromium ion complexes (for example, $Cr(H_2O)_6^{3+/2+}$). Accordingly, the inclusion of chloride in the anolyte (for example, from the chromium-containing compound, the solvent, or both) can be beneficial.

In at least some embodiments, the molarity of iron in the catholyte or the anolyte or both is in a range of 0.5 to 2. In at least some embodiments, the molarity of chromium in the anolyte or the catholyte or both is in a range of 0.5 to 2. In at least some embodiments, the molarity of the hydrochloric acid or other aqueous acid or base is in a range of 0.5 to 4.

One challenge of previous Fe—Cr redox flow batteries is the generation or evolution of hydrogen ($H_2$) at the negative electrode as a result of the redox reactions. In at least some instances, increasing the utilization of the chromium in the redox flow battery can increase the production of hydrogen. It is often desirable to limit or reduce the production of hydrogen in the redox flow battery.

It has been found that limiting the utilization of chromium results in lower hydrogen generation while retaining adequate energy density in the redox flow battery system. In at least some embodiments, the chromium utilization in the anolyte of the redox flow battery system is limited to no more than 80%, 70%, or 60% or less. In at least some embodiments, the chromium utilization in the anolyte is limited by amount of iron in the catholyte or is limited by 100% utilization of the iron in the catholyte.

Chromium utilization can be managed, at least in part, by managing the relative amounts of chromium and iron in the redox flow battery system. The term "molar ratio" as used herein means the ratio of the molar amount of one component with respect to the molar amount of a second component. In at least some embodiments, the molar ratio of chromium in the anolyte to iron in the catholyte (Cr(anolyte)/Fe(catholyte)) is not 1, but, instead, the Cr(anolyte)/Fe(catholyte) molar ratio is at least 1.25 or more (for example, at least 1.43, 1.67, or more). In at least some embodiments, the molar amount of iron in the catholyte is no more than 80%, 70%, or 60% or less of the molar amount of chromium in the anolyte. In at least some embodiments, the smaller amount of available iron limits the utilization of the available chromium to no more than 80%, 70%, or 60%. In at least some embodiments, the anolyte and the catholyte are both mixed iron/chromium solutions.

In at least some embodiments, the concentration of iron in the catholyte is different from the concentration of chromium in the anolyte to produce the desired molar ratio. In at least some embodiments, the concentration of iron in the catholyte is no more than 80%, 70%, or 60% or less of the concentration of chromium in the anolyte.

In at least some embodiments, the concentration of iron in the catholyte and the concentration of chromium in the anolyte is the same. In such embodiments, the molar ratio of chromium and iron in the anolyte and catholyte, respectively, can be selected by selection of the volumes of the anolyte and catholyte. In at least some embodiments, the volume ratio of anolyte to catholyte is at least 1.25:1 or more (for example, at least 1.43:1 or 1.67:1 or more) leading to a molar ratio that is equal to the volume ratio when the concentrations of chromium in the anolyte and iron in the catholyte are the same. In at least some embodiments, the volume of the catholyte is no more than 80%, 70%, or 60% of the volume of the anolyte.

In some embodiments, the volumes of the anolyte and the catholyte can be based on the volume of the respective half-cells 106, 108. In some embodiments, the volumes of the anolyte and the catholyte can be based on the volume of the respective catholyte and anolyte portions of the redox flow battery system 100. For example, the catholyte portion can include the half-cell 108, the catholyte tank 118, and the catholyte distribution arrangement 126. The anolyte portion can include the half-cell 106, the anolyte tank 116, and the anolyte distribution arrangement 124.

It will be recognized that a combination of both different iron and chromium concentrations and different catholyte and anolyte volumes can be used to achieve the desired molar ratio of chromium in the anolyte and iron in the catholyte. In at least some of these embodiments, the volume of the catholyte is no more than 95%, 90%, 80%, 70%, or 60% of the volume of the anolyte.

In at least some instances, it is found that higher $H^+$ concentration in the anolyte promotes hydrogen generation. To reduce hydrogen generation by the anolyte, the $H^+$ concentration in the initial anolyte can be lower than the $H^+$ concentration in the initial catholyte. In at least some embodiments, the $H^+$ concentration in the initial anolyte is at least 10, 20, 25, or 50 percent lower than the $H^+$ concentration in the initial catholyte.

Table 1 illustrates a 1:1 volume ratio of anolyte to catholyte at different states of charge (SOC) where the state of charge represents the percentage conversion of the initial active ionic species in the anolyte and catholyte to the reduced/oxidized ionic species. It will be recognized that the concentration of $H^+$ changes to maintain charge balance between the anolyte and catholyte. In Table 1, the initial anolyte is 1.25M $Fe^{2+}$, 1.25M $Cr^{3+}$, and 1.25M $H^+$ and the initial catholyte is 1.25M $Fe^{2+}$, 1.25M $Cr^{3+}$, and 2.5M $H^+$. These particular concentrations are selected so that the $H^+$ concentration is equal at the 50% state of charge.

TABLE 1

| State of Charge | Anolyte | | | Catholyte | | |
|---|---|---|---|---|---|---|
| | $Cr^{2+}$ | $Cr^{3+}$ | $H^+$ | $Fe^{2+}$ | $Fe^{3+}$ | $H^+$ |
| 0 | 0 | 1.25 | 1.25 | 1.25 | 0 | 2.5 |
| 25 | 0.3125 | 0.9375 | 1.5625 | 0.9375 | 0.3124 | 2.1875 |
| 50 | 0.625 | 0.625 | 1.875 | 0.625 | 0.625 | 1.875 |
| 75 | 0.9375 | 0.3125 | 2.1875 | 0.3125 | 0.9375 | 1.5625 |
| 100 | 1.25 | 0 | 2.5 | 0 | 1.25 | 1.25 |

Table 2 illustrates a 2:1 volume ratio of anolyte to catholyte at different states of charge (SOC). In Table 2, the initial anolyte is 1.25M $Fe^{2+}$, 1.25M $Cr^{3+}$, and 1.5625M $H^+$ and the initial catholyte is 1.25M $Fe^{2+}$, 1.25M $Cr^{3+}$, and 2.5M $H^+$. These particular concentrations are selected so that the $H^+$ concentration is equal when the anolyte is at 25% SOC and the catholyte is at 50% SOC. The difference in SOC between the anolyte and catholyte arises due to anolyte having twice the volume of the catholyte.

TABLE 2

| State of Charge | Anolyte | | | Catholyte | | |
|---|---|---|---|---|---|---|
| | $Cr^{2+}$ | $Cr^{3+}$ | $H^+$ | $Fe^{2+}$ | $Fe^{3+}$ | $H^+$ |
| 0 | 0 | 1.25 | 1.5625 | 1.25 | 0 | 2.5 |
| 25 | 0.3125 | 0.9375 | 1.875 | 0.9375 | 0.3124 | 2.1875 |
| 50 | 0.625 | 0.625 | 2.1875 | 0.625 | 0.625 | 1.875 |
| 75 | | | | 0.3125 | 0.9375 | 1.5625 |
| 100 | | | | 0 | 1.25 | 1.25 |

Another challenge with Fe—Cr redox flow battery systems, as well as other redox flow battery systems, is the presence of metal impurities, such as nickel, antimony, and copper. In at least some instances, these metal impurities can increase hydrogen generation on the negative electrode surface. Such metallic impurities can be present as a natural impurity or as a part of the refining or manufacturing of the iron and chromium compounds or other portions of the redox flow battery system or through any other mechanism.

Figure 3:
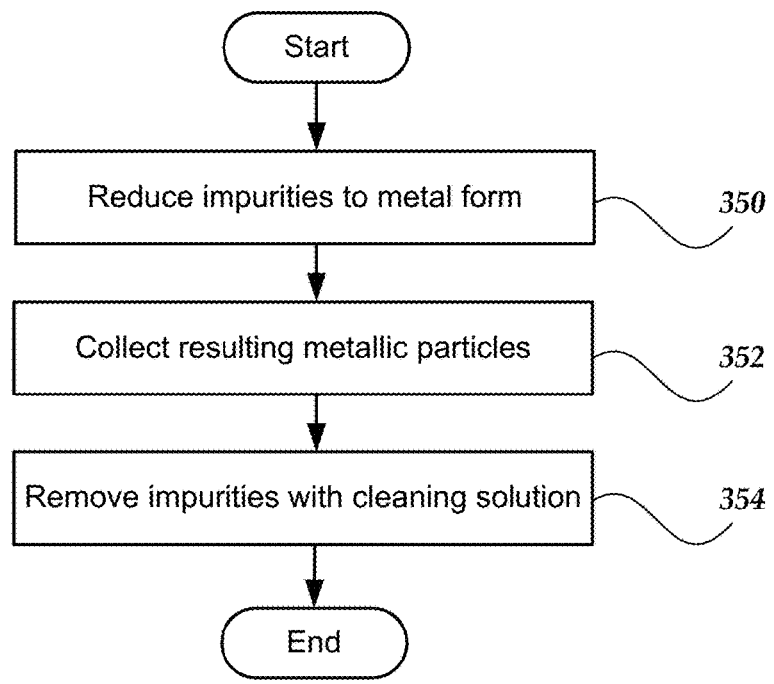
FIG. 3 is a flowchart of a one embodiment of removing or reducing impurities in a redox flow battery system, according to the invention.

In at least some embodiments, the redox flow battery system 100 can be configured to remove, or reduce the level of, these impurities. As illustrated in FIG. 3, in at least some embodiments, to remove, or reduce the level of, these impurities, the redox flow battery system 100 is configured to electrochemically reduce at least some of the impurities to metal form (step 350), collect the resulting metallic particles using a particulate filter or other arrangement such at the interdigitated electrode described below (step 352), and remove these impurities using a cleaning solution containing an oxidizing species (step 354).

Figure 2:
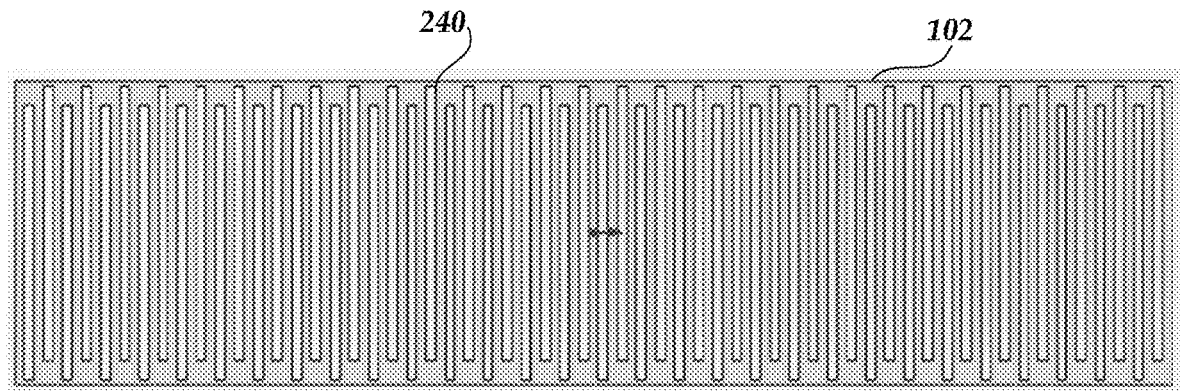
FIG. 2 is a schematic diagram of one embodiment of an electrode for a redox flow battery system, according to the invention.

In at least some embodiments, the impurities are reduced within the anolyte as part of the redox reactions. The impurities form metallic particles or particulates when reduced during charging. The redox flow battery system 100 may include a particulate filter in the half-cell 106 or elsewhere to capture the metallic particles or particulates. In some embodiments, the negative electrode 102 may aid in filtering the metallic particles or particulates. To also facilitate the removal of the impurities, the negative electrode 102 can have an interdigitated structure, as illustrated in FIG. 2. The interdigitated structure includes empty or indented channels 240 for collection of particles of the metallic impurities during operation of the redox flow battery system 100. These particles can then be removed from the electrode during a maintenance cycle, as described below.

In at least some embodiments, the Fe—Cr redox flow battery systems described herein are arranged to remove these impurities using a solution with an oxidizing species, such as $Fe^{3+}$. As part of the maintenance of the redox flow battery system 100, during a maintenance cycle, a $Fe^{3+}$ (or other oxidizing) solution can be flowed through the anolyte portion of the system to remove the impurities from the electrode 102 or elsewhere in the system. In at least some embodiments, the $Fe^{3+}$ solution can be the catholyte or a portion of the catholyte. Alternative oxidizing solutions include, but are not limited to, hydrogen peroxide solutions, ferric chloride solutions, nitric acid, or the like.

In at least some embodiments, the removal or reduction of metallic impurities is performed during manufacturing of the redox flow battery system, prior to the onset of operation of the redox flow battery system, or during operation of the redox flow battery system, or any combination thereof. It will be understood that these methods and systems for removal of metallic impurities are not limited to Fe—Cr redox flow battery systems, but can also be utilized in other redox flow battery systems such as vanadium, vanadium-bromine, vanadium-iron, zinc-bromine, and organic redox flow battery systems.

It has also been found that, in at least some embodiments, occasional exposure of the electrode 102 to the catholyte 114 can facilitate passivation of the surface of the electrode 102 and reduce hydrogen generation. As an example, in one Fe—Cr redox flow battery system the electrode 102 was treated with the catholyte 114 for 1 hour after 17 charge/discharge cycles and the hydrogen generation rate when down from 38.9 ml/min to 10.2 ml/min. In at least some embodiments, operation of the redox flow battery system can periodically (or when initiated or requested by an operator) include a maintenance period in which the half-cell 106 or electrode 102 is exposed to the catholyte (or an electrolyte that has components such as those specified above for the catholyte) for a period of time (for example, 5, 10, 15, 30, 45, 60 minutes or more.) The catholyte may be introduced to the half-cell 106 or electrode 102 once, periodically, intermittently, or continuously during the maintenance period. In at least some of these embodiments, the catholyte 114 can be returned to the catholyte tank 118 after the maintenance period. In at least some embodiments, the maintenance period may be performed when the state of charge of the anolyte is at least 50%, 75% or 90%.

Figure 4:
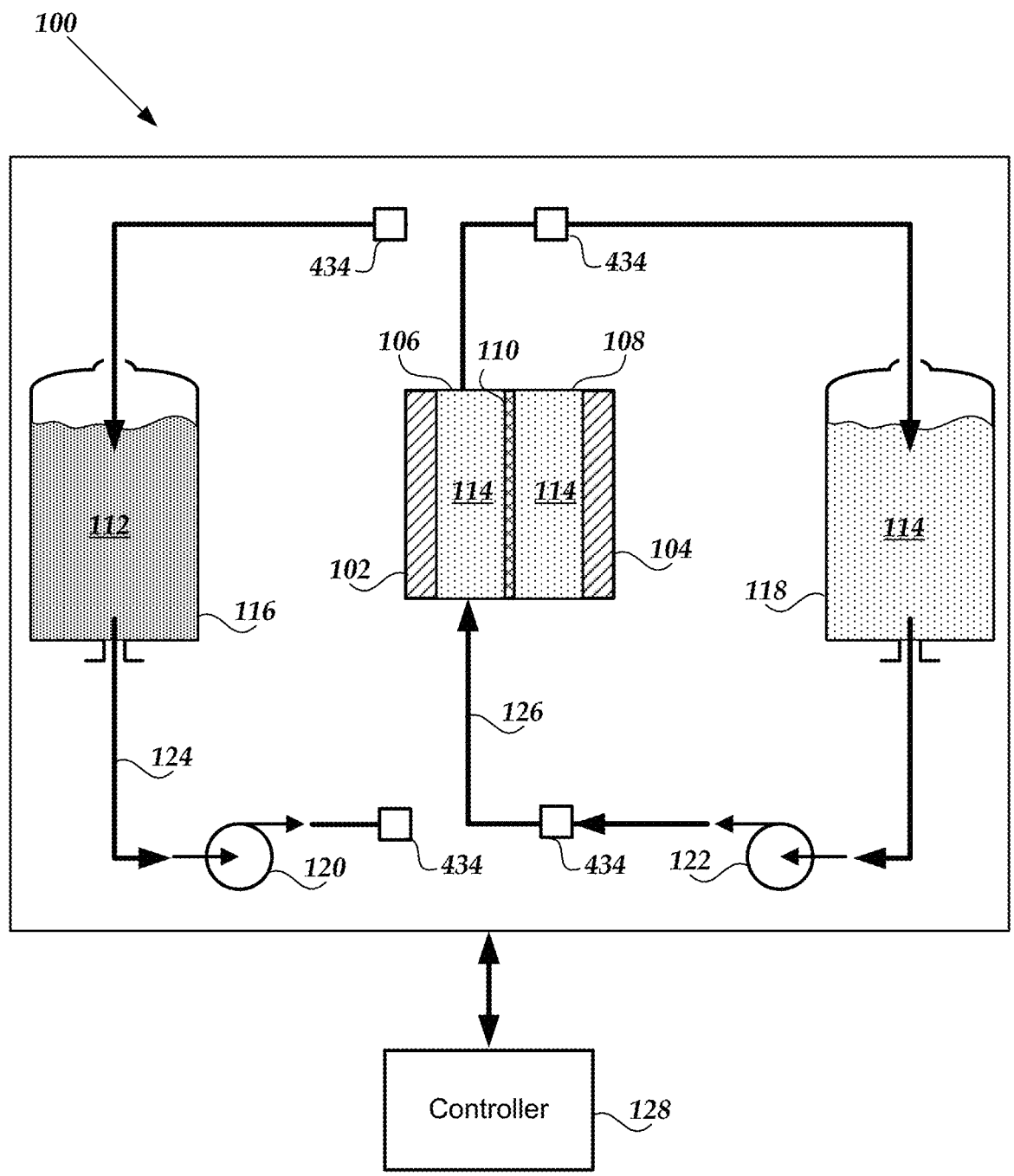
FIG. 4 is a schematic diagram of another embodiment of a redox flow battery system with the catholyte diverted into the second half-cell for maintenance, according to the invention.

FIG. 4 illustrates one embodiment of a redox flow battery system that includes switches 434 for disconnecting the anolyte distribution system 124 from the half cell 106 and connecting the catholyte distribution system 126 to the half-cell 106 to flow catholyte 114 into the half-cell 106. Such an arrangement can be used to reduce or remove metallic impurities or to passivate the electrode 102 or any combination thereof. The pump 122 can be used to flow catholyte 114 into the half-cell 106 or to remove the catholyte 114 from the half-cell 106 when the maintenance is complete.

A Fe—Cr redox flow battery system can have a reduction in storage capacity over time arising, at least in part, from the low standard potential of the $Cr^{2+}/Cr^{3+}$ pair which results in at least some level of hydrogen generation on the anolyte side of the system. As a result the Average Oxidation State (AOS) of the active species in the system increases and the system can become unbalanced and the storage capacity decrease. It is useful, therefore, to have methods or arrangements for at least partially restoring the storage capacity by recovering the AOS.

In at least some embodiments, the AOS for a Fe—Cr redox flow battery system can be described as: AOS= ((Moles of $Fe^+$ in catholyte and anolyte)*3+(Moles of $Fe^{2+}$ in catholyte and anolyte)*2+(Moles of $Cr^+$ in anolyte and catholyte)*3+(Moles of $Cr^{2+}$ in anolyte and catholyte)*2)/ (Moles of Fe in catholyte and anolyte+Moles of Cr in anolyte and catholyte).

To rebalance the redox flow battery system, in at least some embodiments, the redox flow battery system includes a balance arrangement, in conjunction with either the anolyte or catholyte, to rebalance the system and restore storage capacity. In at least some embodiments, the balance arrangement utilizes a vanadium source (to produce oxovanadium ($VO^{2+}$) and dioxovanadium ($VO_2^+$) ionic species) and a reductant, such as an oxidizable hydrocarbon compound, to rebalance the system and restore storage capacity. The following embodiments illustrate the addition of a balance arrangement to a Fe—Cr redox flow battery system. It will be understood that such balance arrangements can be used with other redox flow battery systems, or other chemical and/or electrochemical systems.

Figure 5A:
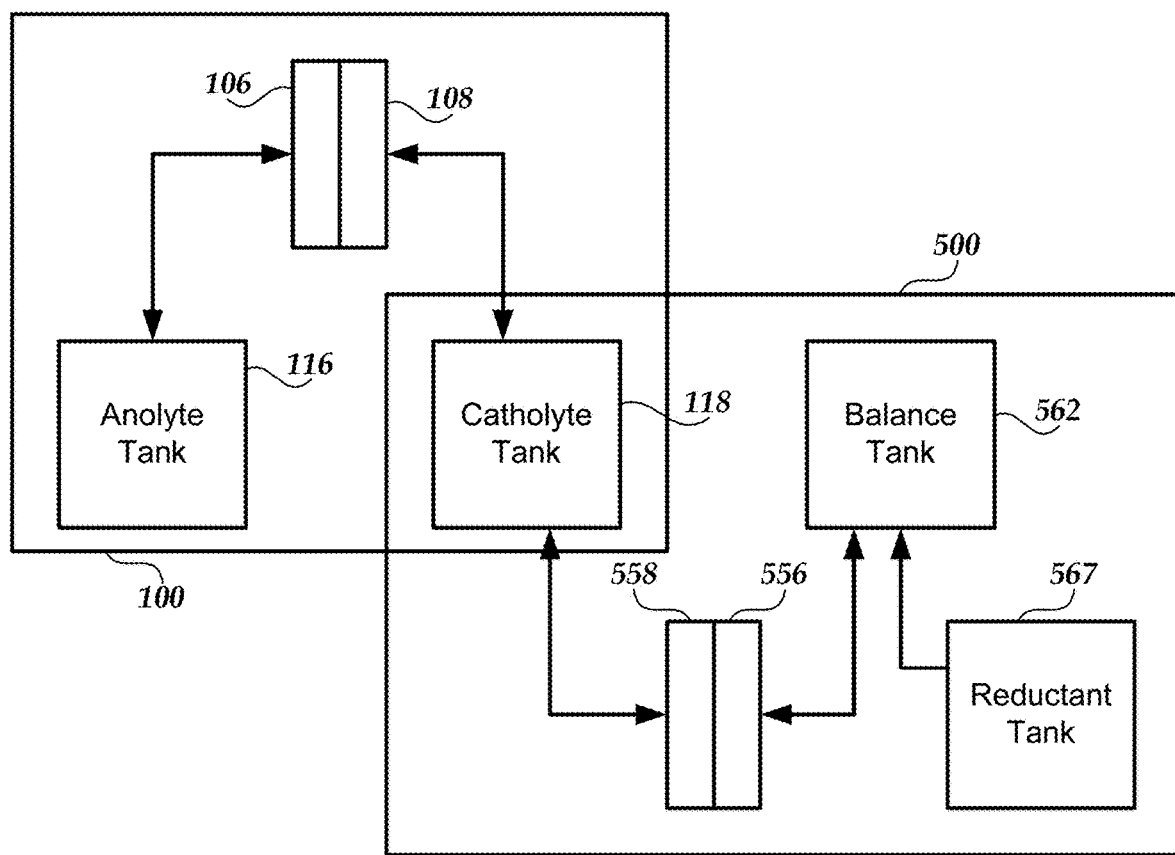
FIG. 5A is a schematic diagram of one embodiment of a system that includes a redox flow battery system in conjunction with a balancing arrangement, according to the invention.
Figure 5B:
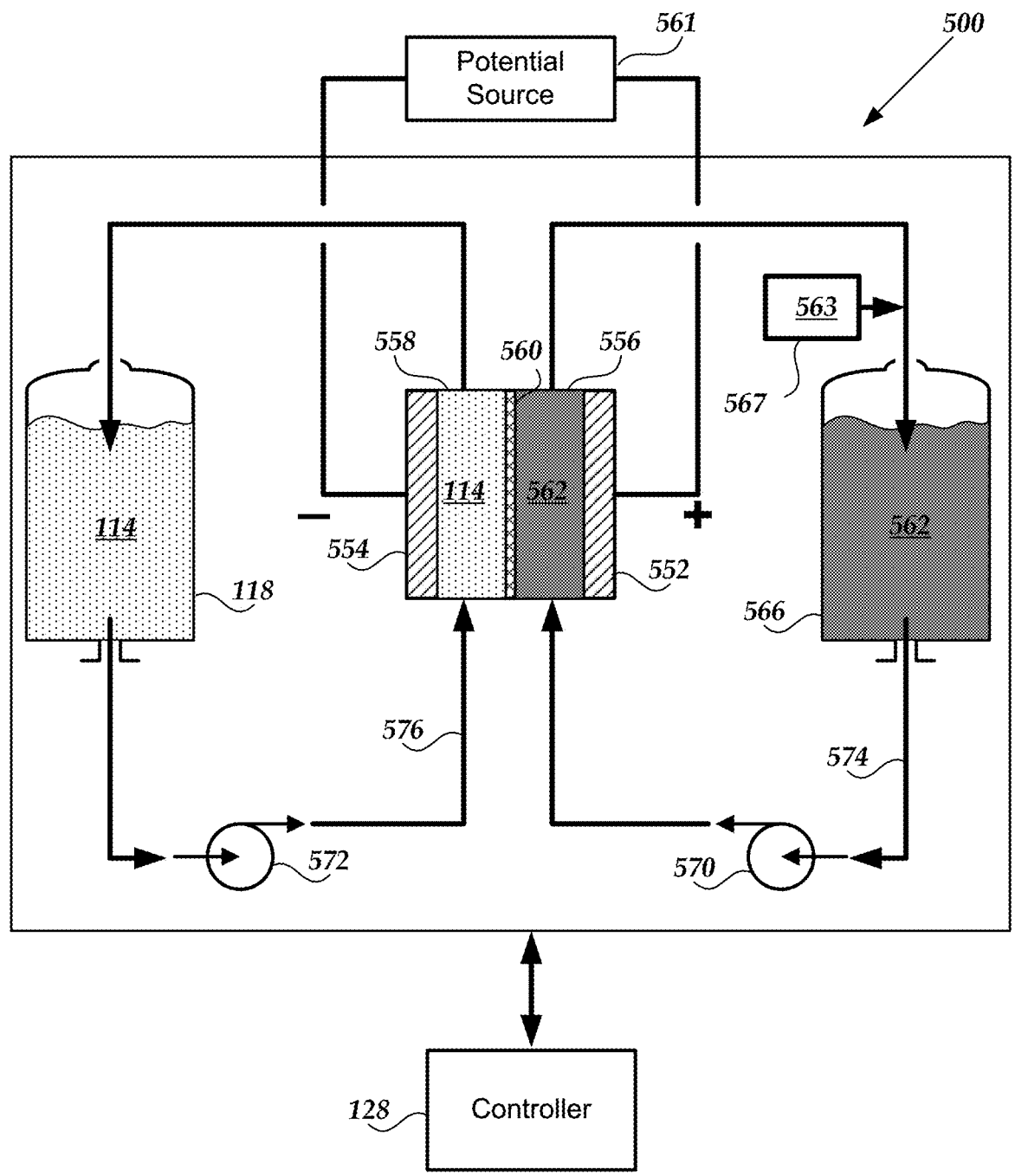
FIG. 5B is a schematic diagram of one embodiment of the balancing arrangement of the system of FIG. 5A, according to the invention.

FIG. 5A illustrates one embodiment of portions of the redox flow battery system 100 and a balance arrangement 500. FIG. 5B illustrates one embodiment of the balance arrangement 500. In this embodiment, the catholyte 114 is used in conjunction with a balancing electrolyte 562 (for example, an electrolyte containing $VO^{2+}/VO_2^+$) and a reductant 563 to rebalance the redox flow battery system 100. The balance arrangement 500 includes the catholyte tank 118; balance electrodes 552, 554; balance half-cells 556, 558; balance separator 560; catholyte balance pump 572; catholyte balance distribution system 576; balance tank 566; reductant tank 567; balance electrolyte pump 570; balance electrolyte distribution arrangement 574; and potential source 561.

The following reaction equations illustrate one example of the rebalancing of the system using the iron-based catholyte 114, a balancing electrolyte 562 containing oxovanadium ions, and a reductant 563 containing fructose, along with the application of an external potential from the potential source 561 of at least 0.23 V:

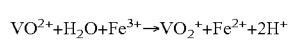

$$VO^{2+}+H_2O+Fe^{3+} \rightarrow VO_2^+ + Fe^{2+} + 2H^+$$

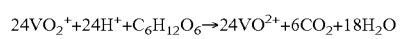

$$24VO_2^+ + 24H^+ + C_6H_{12}O_6 \rightarrow 24VO^{2+} + 6CO_2 + 18H_2O$$

Via these reactions, the AOS of the redox flow battery system 100 can be reduced and the $H^+$ ions lost in hydrogen generation restored. In at least some embodiments, this rebalancing (or restoring of the AOS or storage capacity recovery) does not utilize any metallic catalyst as such catalysts often increase hydrogen generation. In at least some embodiments, $VO^{2+}$ of the balance electrolyte 562 can be considered a homogeneous catalyst as the $VO^{2+}$ ions are regenerated using the reductant 563. In at least some embodiments, the reduction of $VO_2^+$ ions happens in balance half cell 566.

In at least some embodiments, the oxidation of the reductant 563 can be performed in the balance tank 566 instead of the half-cell 556 and may not require the application of an external potential, as long as $VO_2^+$ ions are available. Suitable reducing agents include sugars (for example, fructose, glucose, sucrose, or the like or any combination thereof), carboxylic acids (for example, formic acid, acetic acid, propionic acid, oxalic acid, or the like or any combination thereof), aldehydes (for example, formaldehyde, acetaldehyde, or the like or any combination thereof), alcohols (for example, methanol, ethanol, propanol, or the like or any combination thereof), other hydrocarbons, or hydrogen gas. In at least some embodiments, the reductant is soluble or at least partially soluble in water.

In at least some embodiments, the reductant 563 is added either periodically, intermittently, or continuously to the balance electrolyte 562 from the reductant tank 567. In at least some embodiments, this rebalancing process (for recovering the storage capacity or restoring the AOC) occurs continuously, intermittently, or periodically. For example, the catholyte balance pump 572 and balance electrolyte pump 570 can operate continuously, intermittently, or periodically. In at least some embodiments, the catholyte pump 122 can also be used as the catholyte balance pump 572. Moreover, the catholyte balance distribution arrangement 576 may include a valve to couple to, or disconnect from, the catholyte tank 118.

Figure 5C:
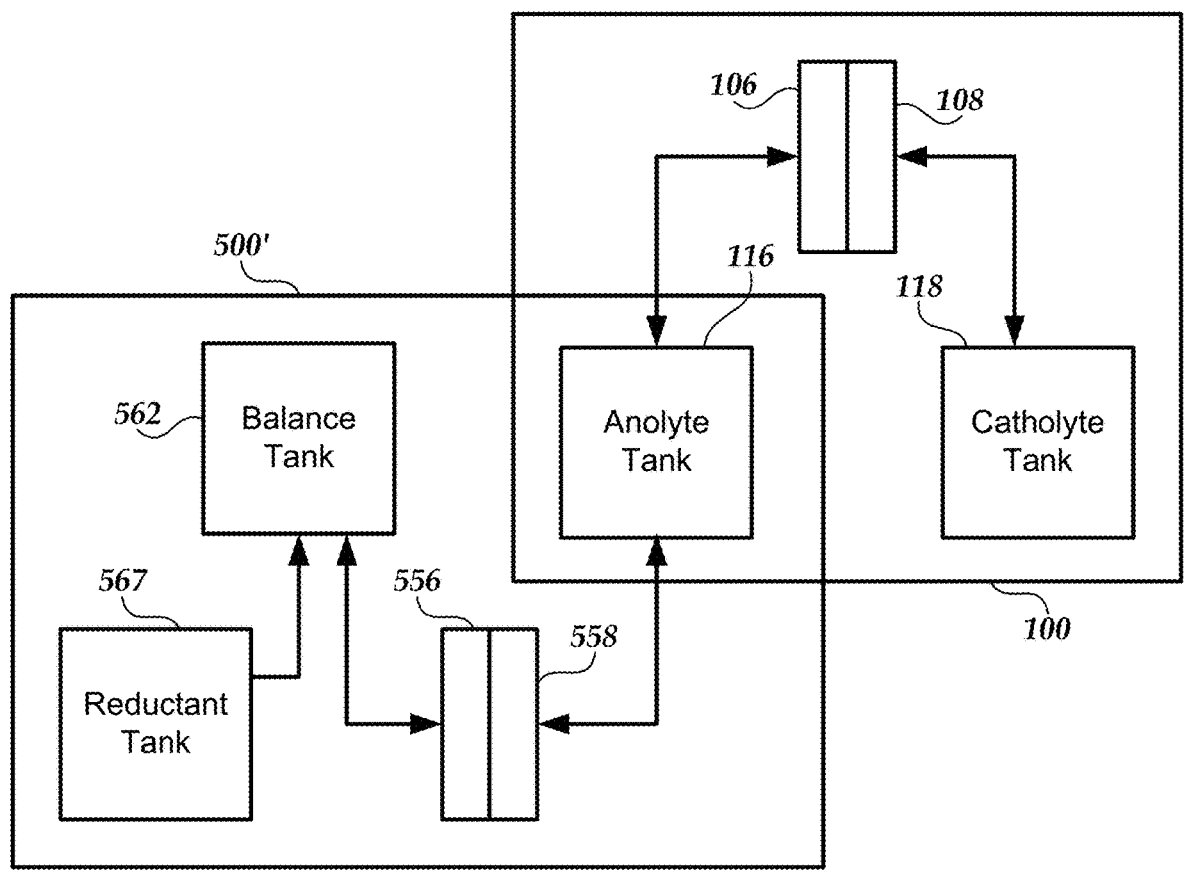
FIG. 5C is a schematic diagram of another embodiment of a system that includes a redox flow battery system in conjunction with a balancing arrangement, according to the invention.
Figure 5D:
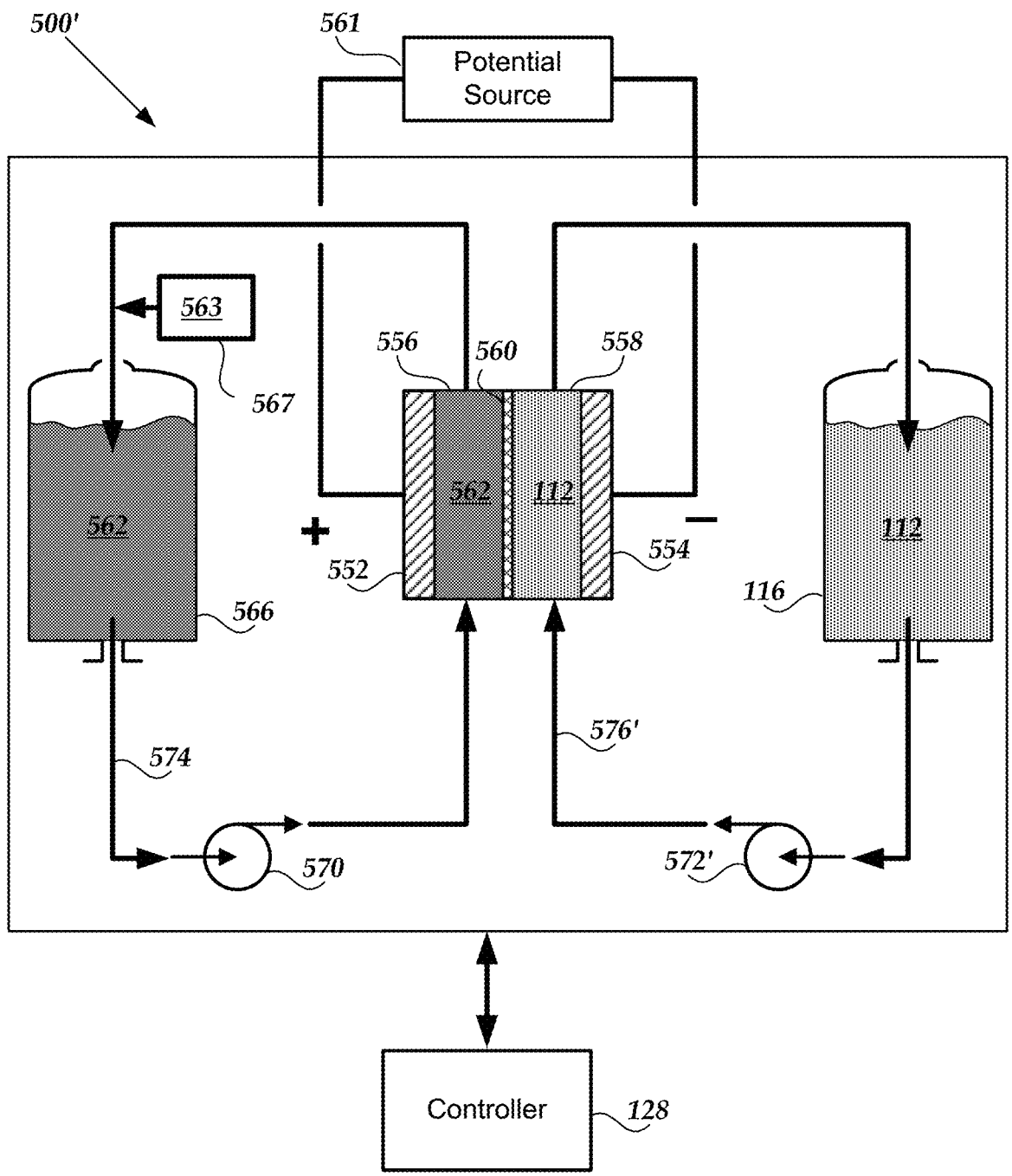
FIG. 5D is a schematic diagram of one embodiment of the balancing arrangement of the system of FIG. 5C, according to the invention.

FIGS. 5C and 5D illustrate another embodiment of redox flow battery system 100 with a balance arrangement 500' which operates with the anolyte 112 (and corresponding anolyte pump 572' and anolyte balance distribution arrangement 576') instead of the catholyte. In at least some embodiments, the anolyte pump 120 can also be used as the anolyte balance pump 572'.

The following reaction equations illustrate one example of the rebalancing of the system using the chromium-based anolyte 112, a balancing electrolyte 562 containing oxovanadium ions, and a reductant 563 containing fructose, along with the application of an external potential from the potential source 561 of at least 1.40 V:

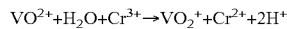

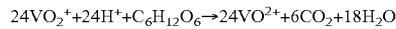

Figure 5E:
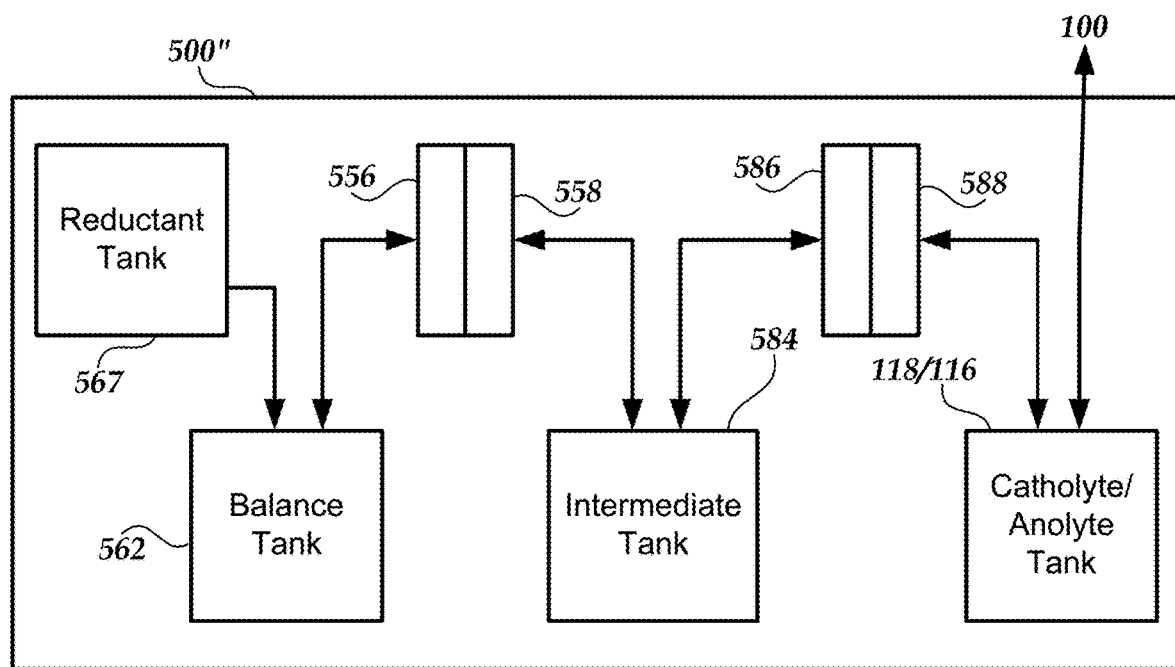
FIG. 5E is a schematic diagram of another embodiment of a balancing arrangement, according to the invention.

FIG. 5E illustrates another embodiment of a balance arrangement 500" which can be adapted to operate with either the catholyte or anolyte and the corresponding catholyte/anolyte tank 118/116 that is coupled to the remainder of the redox flow battery system 100. This embodiment incorporates an intermediate tank 584 and two intermediate half-cells 586, 588 between the catholyte/anolyte tank 118/116 and the balance tank 562 and corresponding half-cells 556/558. (As with the balance tank, there can be an intermediate pump and intermediate distribution arrangement, as well as an intermediate separator between the two half-cells 586, 588 and a source potential to apply a potential between the electrodes of the two half-cells 586, 588.) In one embodiment, the intermediate electrolyte in the intermediate tank 584 contains $V^{2+}/V^{3+}$ ions.

The following reaction equations illustrate one example of the rebalancing of the system using balance arrangement 500" and the catholyte 114 of redox flow battery system 100 (FIG. 1).

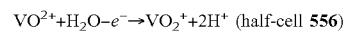

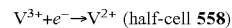

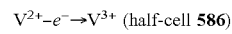

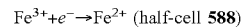

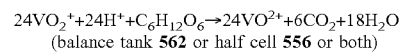

Another embodiment uses the anolyte ($Cr^{2+}/Cr^{3+}$) instead of the catholyte in conjunction with the intermediate electrolyte and balance electrolyte. Yet another embodiment uses the anolyte and replaces the $V^{2+}/V^{3+}$ intermediate electrolyte with a $Fe^{2+}/Fe^{3+}$ intermediate electrolyte.

It will be recognized that the balance arrangement described herein can be utilized with other redox flow battery systems and, in particular, those that are capable of generating hydrogen gas. Examples of such redox flow battery system include, but are not limited to, Zn—Br or Zn—Cl redox flow battery systems, vanadium-based (for example, all vanadium, V—Br, V—Cl, or V-polyhalide) redox flow battery systems; Fe—V or other iron-based redox flow battery systems (for example, an all iron redox flow battery system); or organic redox flow battery systems.

Figure 6A:
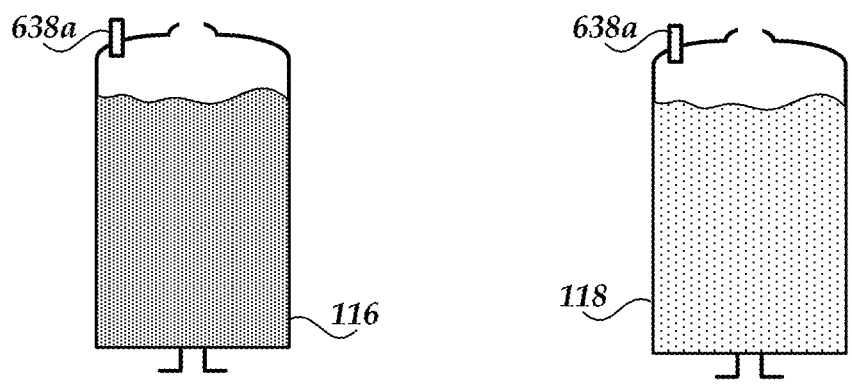
FIG. 6A is a schematic diagram of electrolyte tanks of a redox flow battery system with pressure release valves, according to the invention.
Figure 6B:
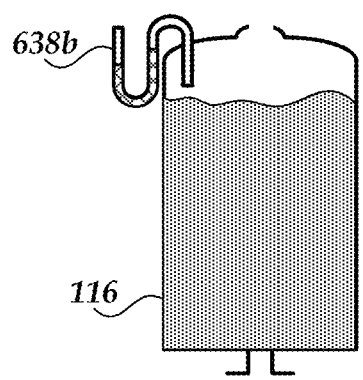
FIG. 6B is a schematic diagram of an electrolyte tank of a redox flow battery system with a liquid-containing U-tube arrangement for pressure relief, according to the invention.
Figure 6C:
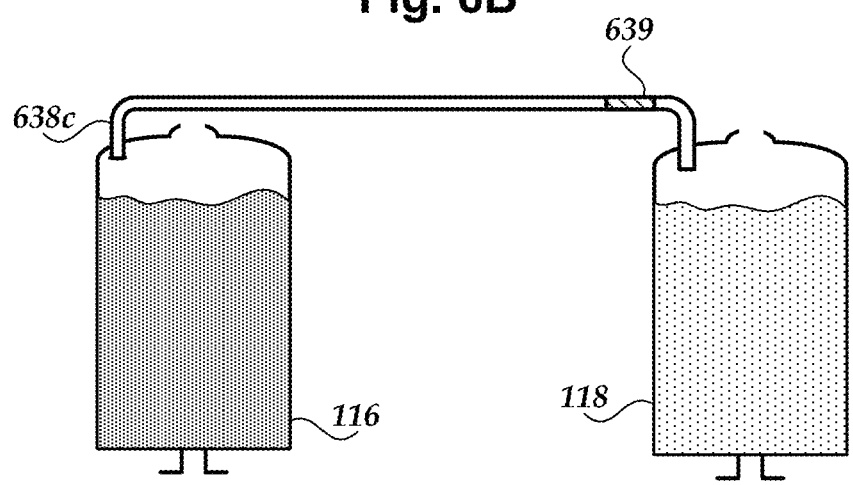
FIG. 6C is a schematic diagram of electrolyte tanks of a redox flow battery system with an arrangement for migration of gas between the tanks, according to the invention.

In some embodiments, during $Fe^{2+}$-overcharging conditions, chlorine gas ($Cl_2$) can be generated on the catholyte side of the redox flow battery system 100. The chlorine may be confined in the catholyte headspace of, for example, the catholyte tank 118 or half-cell 108 or the like or any combination thereof. Continued generation of chlorine gas increases the pressure in the confined catholyte headspace. In at least some embodiments, this may result in the chlorine gas migrating to the anolyte headspace via a connection 638c (FIG. 6C) which optionally includes one or more valves or switches 639 to control flow. In at least some embodiments, at least a portion of the chlorine gas may be absorbed by the anolyte solution. In at least some embodiments, the following reactions can occur between chlorine and the anolyte solution to chemically discharge the overcharged system:

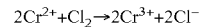

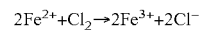

In at least some embodiments, the redox flow battery system 100 may include a pressure release system to manage pressure in the catholyte or anolyte headspace. For example, a pressure relief valve 638a (FIG. 6A) or a liquid-containing U-tube arrangement 638b (FIG. 6B) may be coupled to the catholyte headspace to manage the pressure. Similarly, a pressure relief valve or a liquid-containing U-tube arrangement may be coupled to the anolyte headspace. In at least some embodiments, gas in the anolyte or catholyte headspace may exchange with an environmental atmosphere via a bi-directional gas pressure control system such as the U-tube arrangement. In at least some embodiments, a U-tube arrangement may also be used as a gas leak monitor. In at least some embodiments, the liquid in a U-tube arrangement may contain an acid level indicator that can be used to estimate the amount of acid-containing gas released into the environment by the redox flow battery system.

In at least some instances, the acidic solutions and chemical vapor from leaks of the electrolytes and chemical products of the redox reactions can damage electronic devices (for example, the controller 128, switches, valves, pumps, sensors, or the like) in the redox flow battery system 100. In addition, the leaks may result in environmental damage or contamination.

Figure 7:
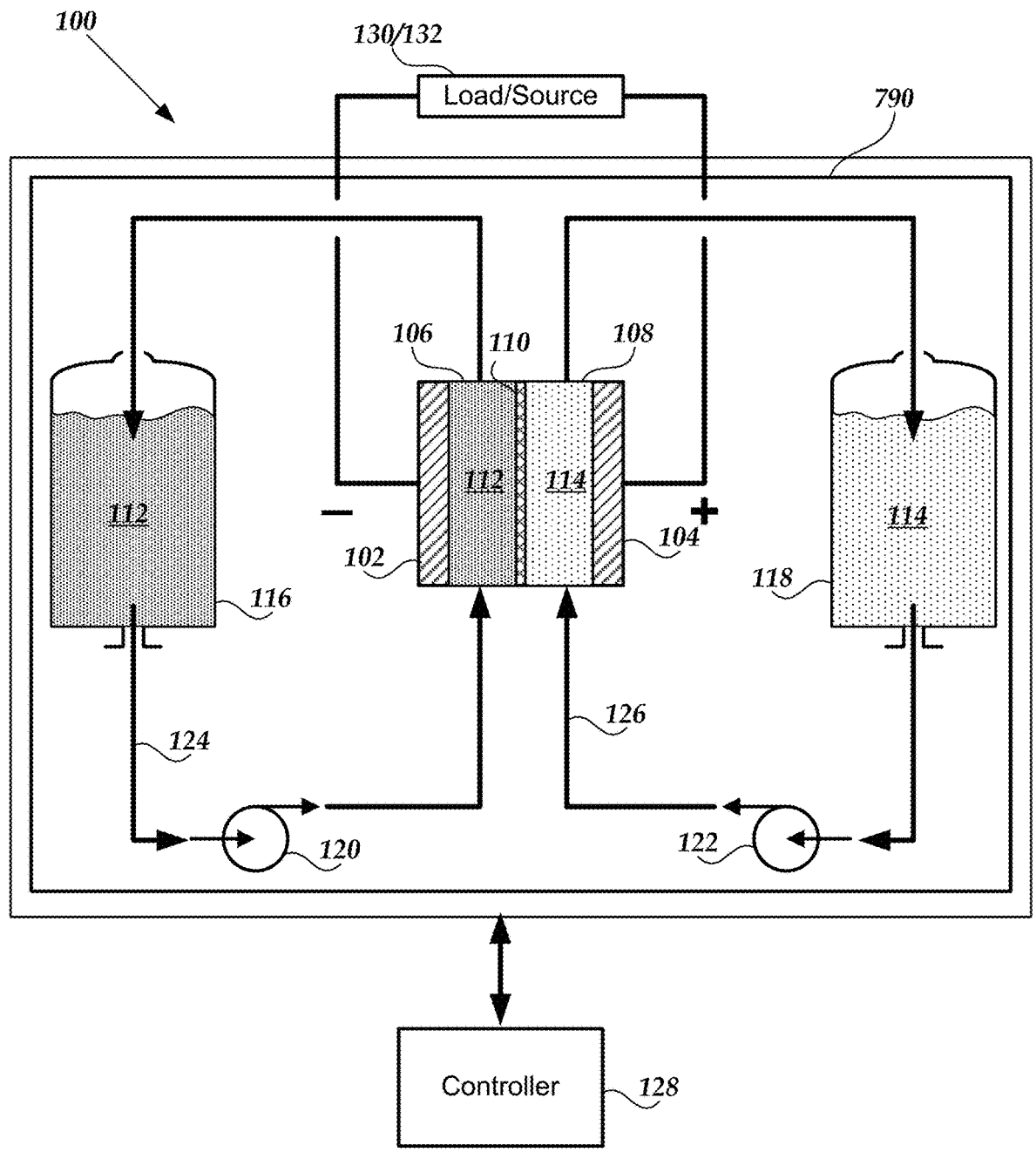
FIG. 7 is a schematic diagram of another embodiment of a redox flow battery system with a secondary container, according to the invention.

In at least some embodiments, all or a portion of the redox flow battery system 100 that contains the anolyte or catholyte or both can be situated in a secondary container 790 (FIG. 7) that contains acid absorbent material, such as sodium carbonate, sodium bicarbonate, calcium carbonate, or calcium oxide or the like. In at least some embodiments, the secondary container can contain sufficient acid absorbent material to neutralize at least 10, 25, 40, 50, 60, 70, 75, 90 percent or more of the anolyte or catholyte or both.

Figure 8:
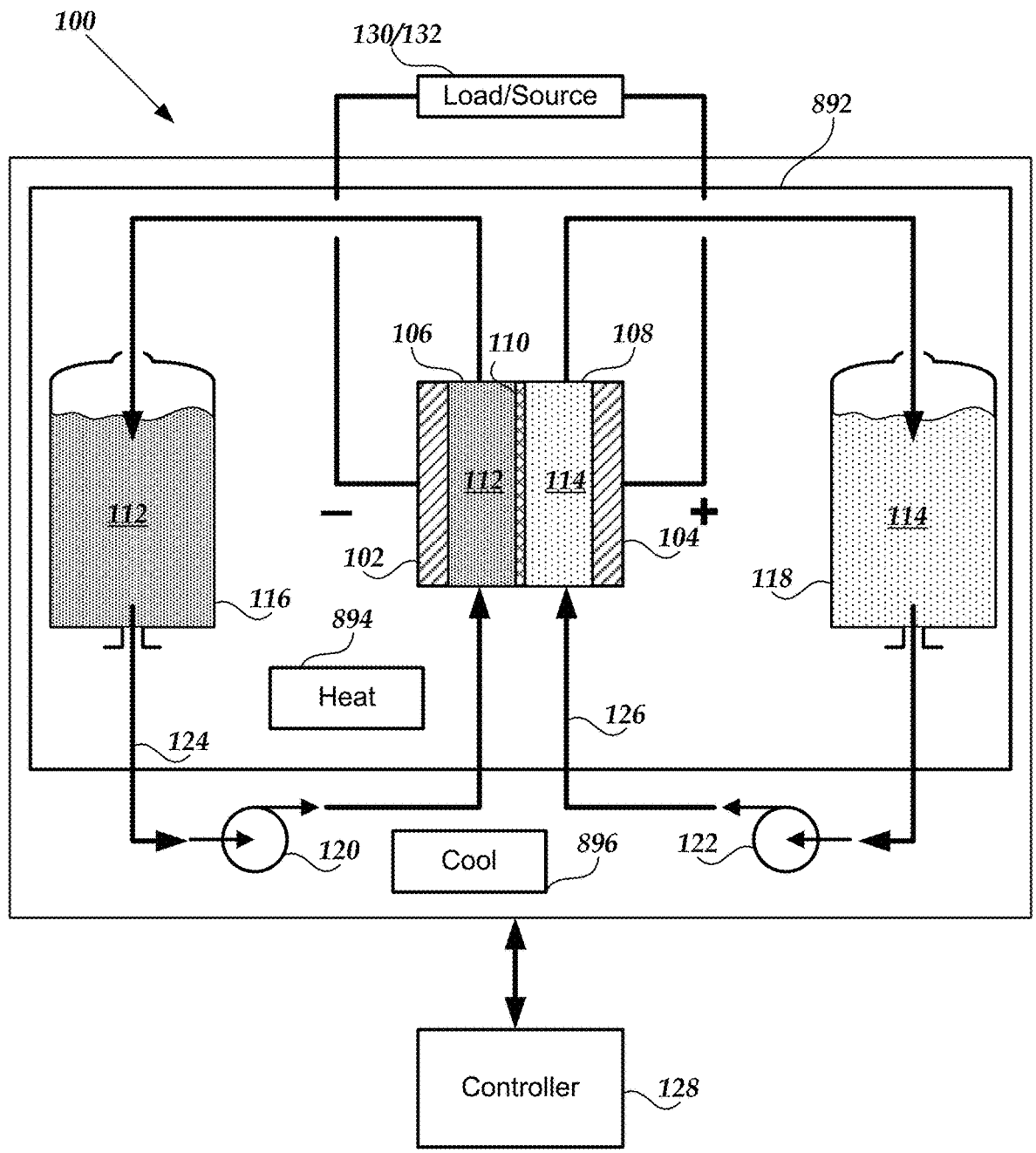
FIG. 8 is a schematic diagram of another embodiment of a redox flow battery system with a temperature zone, according to the invention.

In some embodiments, the anolyte and catholyte containing components, such as the anolyte or catholyte tanks 116, 118, half-cells 106, 108, at least some portions of the anolyte or catholyte distribution systems 124, 126, electrodes 102, 104, or the like, of the redox flow battery system 100 are maintained at a temperature of at least 50, 60, 70, or 80 degrees Celsius or more during charge or discharge periods in a temperature zone 892, as illustrated in FIG. 8. The temperature of these components may be maintained using one or more heating devices 894. In addition, one or more of electronic components of the redox flow battery system, such as one or more of the controller 128, the pumps 120, 122, one or more sensors, one or more valves, or the like, are maintained at a temperature of no more than 40, 35, 30, 25, or 20 degrees Celsius or less. The temperature of these components may be maintained using one or more cooling devices 896.

In a redox flow battery system, the Average Oxidation State (AOS) of the active species in the catholyte or the anolyte (or both) can change, particularly under conditions such as hydrogen generation or oxygen intrusion in the system. As a result of the AOS change, the system can become unbalanced, the system storage capacity may decrease, or side reactions, such as hydrogen generation, may be accelerated, or any combination of these effects.

It is useful to know the AOS of a redox flow battery system. Conventional AOS determination methods include taking samples and conducting an off-line potential titration analysis, obtaining in situ UV-Vis measurement; or performing in situ potential difference measurements against a reference electrode. These techniques can be slow or may be relatively inaccurate.

In contrast to these conventional techniques, relatively fast and accurate methods are presented herein. The method includes measuring the capacity of ions in at least one of the electrolytes during a low potential charging process and using this charging capacity and the known volume of the electrolyte to determine the AOS.

Figure 9:
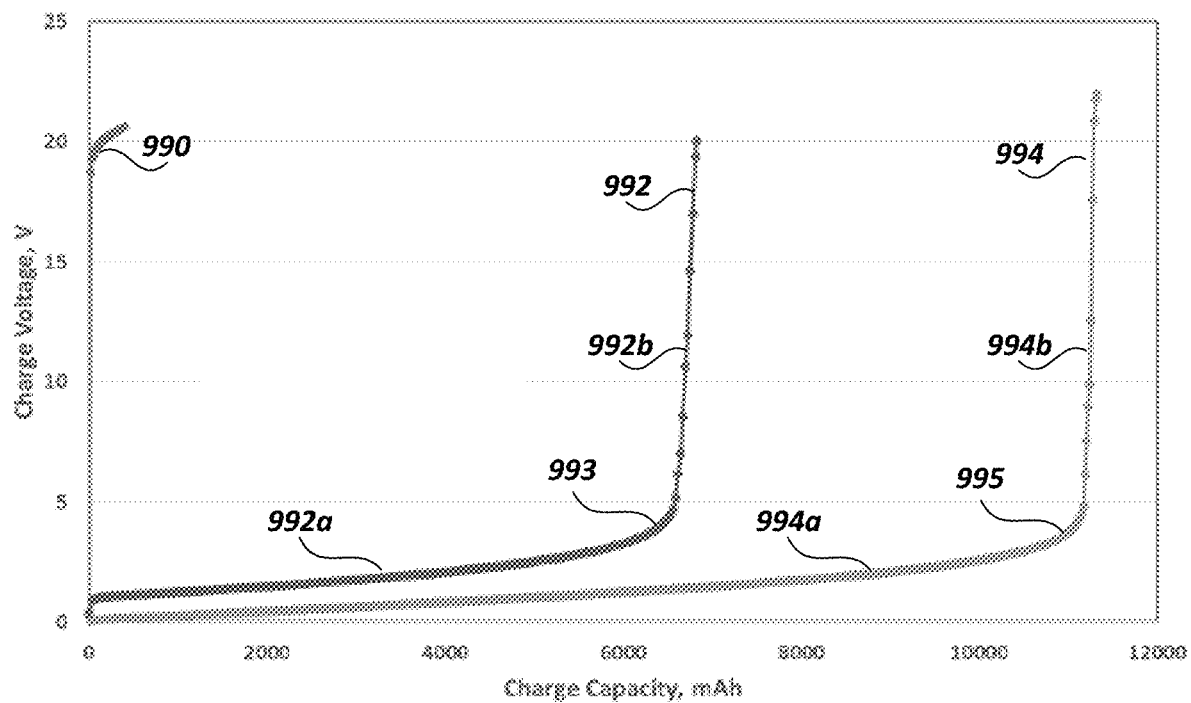
FIG. 9 is a graph of charge capacity versus charge voltage for one balanced redox flow battery system and two unbalanced redox flow battery systems, according to the invention.

FIG. 9 illustrates three different charging curves for a redox flow battery system. The first charging curve 990 is for a balanced system. The second charging curve 992 and third charging curves 994 are for two different un-balanced systems. In the unbalanced systems, there is a low potential charging region 992a, 994a and a high potential charging region 992b, 994b. By performing one or more measurements in the low potential charging region 992a, 994a, the AOS can be determined.

This AOS determination methods will be illustrated using the Fe—Cr redox flow battery system described above. It will be understood, however, that these methods can be used with any other suitable redox flow battery system. In this example, both the catholyte and the anolyte include iron and chromium ions. For a balanced system, when the redox flow battery system is fully discharged, there is only $Fe^{2+}$ and $Cr^{3+}$ in both the anolyte and catholyte. Upon application of a charge, the system undergoes the following redox reactions:

$Fe^{2+} \rightarrow Fe^{3+} + e$ (E°=+0.77 V, positive side)

$Cr^{3+} + e^- \rightarrow Cr^{2+}$ (E°=−0.40 V, negative side)

The potential difference between the positive and negative electrolytes can increase to more than 0.9 V immediately in at least some embodiments, as illustrated by first charging curve 990 in FIG. 9.

If the system is unbalanced, however, AOS increases due to side reactions. For example, a mixture of $Fe^{2+}/Fe^{3+}/Cr^{3+}$ can be found in the discharged electrolyte of an unbalanced Fe—Cr redox flow battery system. For such a mixture of ions, when a charge is applied to the redox flow battery system, the system first undergoes the following redox reactions:

$Fe^{2+} \rightarrow Fe^{3+} + e$ (positive side)

$Fe^{3+} + e^- \rightarrow Fe^{2+}$ (negative side)

These reactions occur at low potential until all of the $Fe^{3+}$ ions are consumed at the negative electrolyte. This corresponds to the low potential charging region 992a, 994a in FIG. 9. Only after consuming all of the $Fe^{3+}$ ions will the chromium ions be reduced at the higher charging potential, as illustrated in high potential charging regions 992b, 994b.

The charge capacity of this low potential charging process can be used to determine the amount of $Fe^{3+}$ ions in the anolyte. For example, the charge capacity at the turning point 993 of FIG. 9 divided by 26.8 Ah/mole (the charge on one mole of electrons) gives the molar amount of $Fe^{3+}$ in the anolyte. This combined with the volume of the positive and negative electrolytes can be used to determine the AOS of the redox flow battery system.

This information can also be used to rebalance the redox flow battery system using, for example, the balance arrangements described above. As an example, using the balance arrangement 500 illustrated in FIGS. 5A and 5B, a balancing electrolyte 562 containing oxovanadium ions, and a reductant 563 containing fructose, along with the application of an external potential from the potential source 561 of at least 0.23 V produces the following reactions:

$VO^{2+} + H_2O + Fe^{3+} \rightarrow VO_2^+ + Fe^{2+} + 2H^+$ $24VO_2^+ + 24H^+ + C_6H_{12}O_6 \rightarrow 24VO^{2+} + 6CO_2 + 18H_2O$ Rebalancing the AOS can be accomplished by providing the reductant 563 (fructose) to the balancing electrolyte 562. For example, ideally providing a molar amount of fructose equal to the molar amount of $Fe^{3+}$ multiplied by (1/24) can rebalance the AOS. It will be recognized that more fructose may be used to fully rebalance the AOS due to the non-ideal elements in the system.

Figure 10:
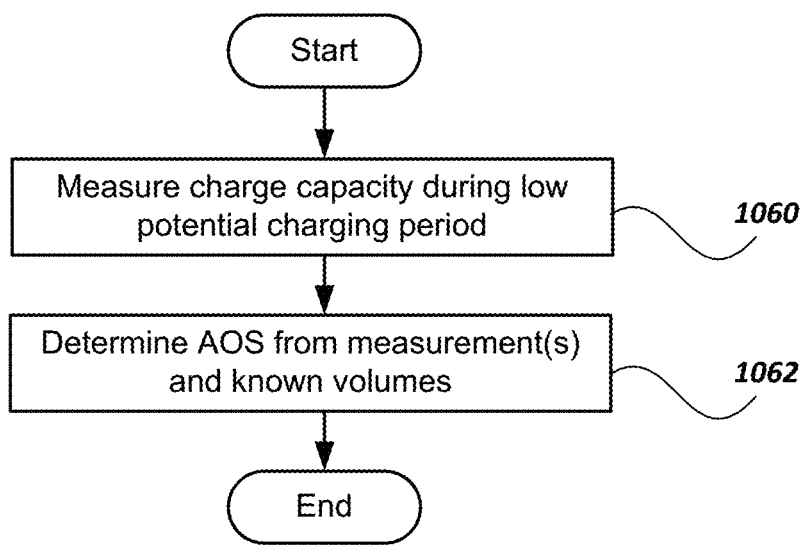
FIG. 10 is a flowchart of one embodiment of a method of determining an average oxidation state (AOS) of a redox flow battery system, according to the invention.

FIG. 10 is a flowchart of one embodiment of a method of determining AOS. In step 1060, the charge capacity during a low potential charging period is measured. For example, the charge capacity can be measured as the charge capacity when the charging curve changes from the low potential charging period to the high potential charging period, such as, for example, at turning points 993, 995 in FIG. 9. In step 1062, the AOS can then be determined using this measurement (or set of measurements) and the known volumes of the anolyte and catholyte and the known iron and chromium concentrations of the catholyte and anolyte, respectively. In at least some embodiments, prior to step 1060, the anolyte 112 and catholyte 114 in the redox flow battery system 100 can be fully discharged by applying an external potential or by complete mixing of the anolyte and catholyte. In at least some embodiments, the catholyte and anolyte may be fully mixed prior to determining the charge capacity.

Figure 11:
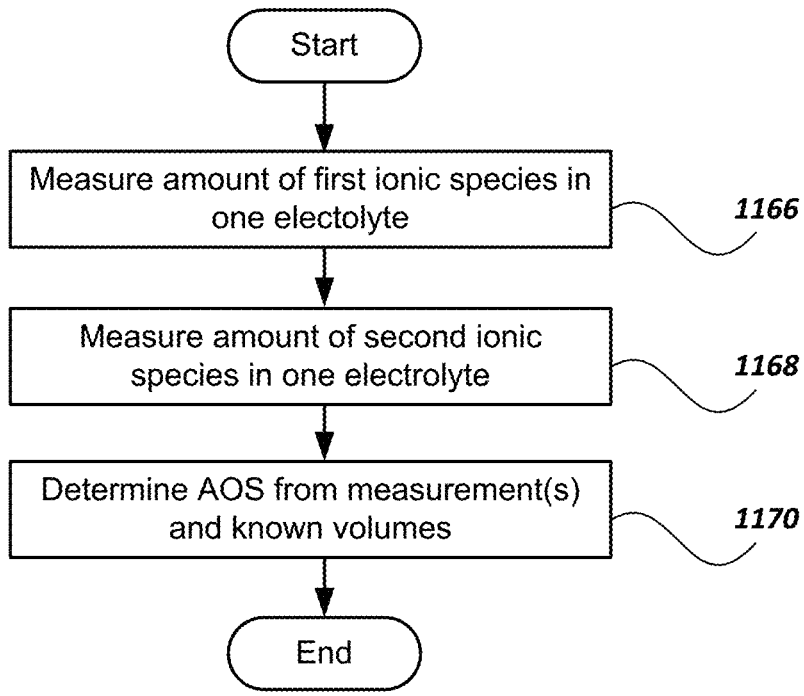
FIG. 11 is a flowchart of another embodiment of a method of determining an average oxidation state (AOS) of a redox flow battery system, according to the invention.

Another embodiment does not require a fully discharged system, but can be determined for any state-of-charge condition using columbic titration. FIG. 11 is a flowchart of one embodiment of this method. In step 1166, the amount of one ionic species (for example, $Fe^{3+}$ or $Cr^{3+}$) is measured in one of the electrolytes (catholyte or anolyte) by halting the flow of that electrolyte and performing in situ titration of the first ionic species in the non-flowing electrolyte. The balance arrangement 500 or the other electrolyte, which is preferably continuing to flow through the redox flow battery system, can be used to titrate the ionic species. As an example, the amount of $Fe^{3+}$ can be determined in the catholyte by halting flow of the catholyte and titrating the $Fe^{3+}$ using either a) the vanadium ions in the balance arrangement 500 or b) the $Cr^{2+}$ in the anolyte, which may continue to flow through the redox battery system in order to ensure that there is sufficient $Cr^{2+}$ ions to titrate all of the $Fe^{3+}$.

In step 1168, the amount of a second ionic species (for example, $Cr^{2+}$ or $Fe^{2+}$) is measured in one of the electrolytes (anolyte or catholyte) by halting the flow of that electrolyte and performing in situ titration of the second ionic species in the non-flowing electrolyte. Preferably, the second ionic species is measured in a different electrolyte from the electrolyte in which the first ionic species is measured so that one ionic species is measured in the catholyte and one ionic species is measured in the anolyte. In at least some embodiments, the measurement of the first ionic species will alter the amount or concentration of the second ionic species so that the measurement of the second ionic species will be adjusted to take into account this alteration. The balance arrangement 500 or the other electrolyte, which is preferably continuing to flow through the redox flow battery system, can be used to titrate the ionic species. As an example, the amount of $Cr^{2+}$ can be determined in the anolyte by halting flow of the anolyte and titrating the $Cr^{2+}$ using either a) the vanadium ions in the balance arrangement 500 or b) the $Fe^{3+}$ in the catholyte, which may continue to flow through the redox battery system in order to ensure that there is sufficient $Fe^{3+}$ ions to titrate all of the $Cr^{2+}$.

In step 1170, the AOS can then be determined using these two measurements, the initial concentrations or amounts of iron and chromium, the volumes of the half-cells, and the volumes of the anolyte and catholyte.

Figure 12:
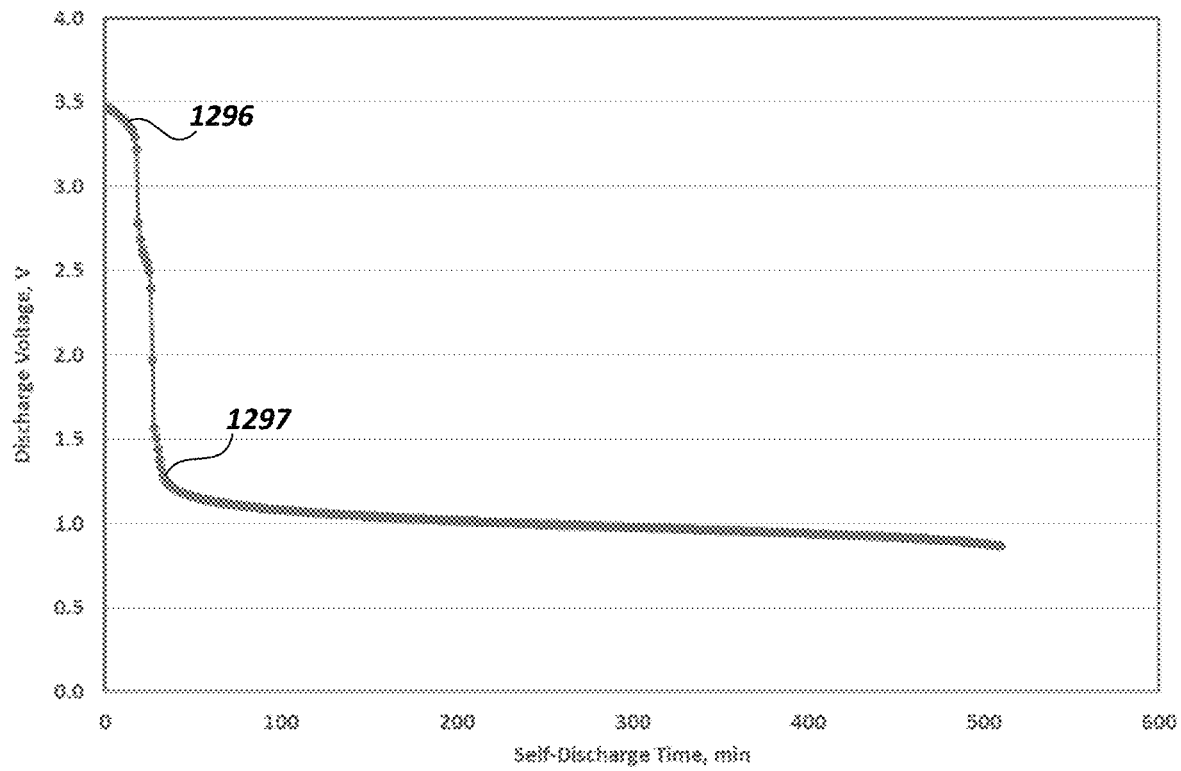
FIG. 12 is a graph of self-discharge time versus discharge voltage for an unbalanced redox flow battery system, according to the invention.
Figure 13:
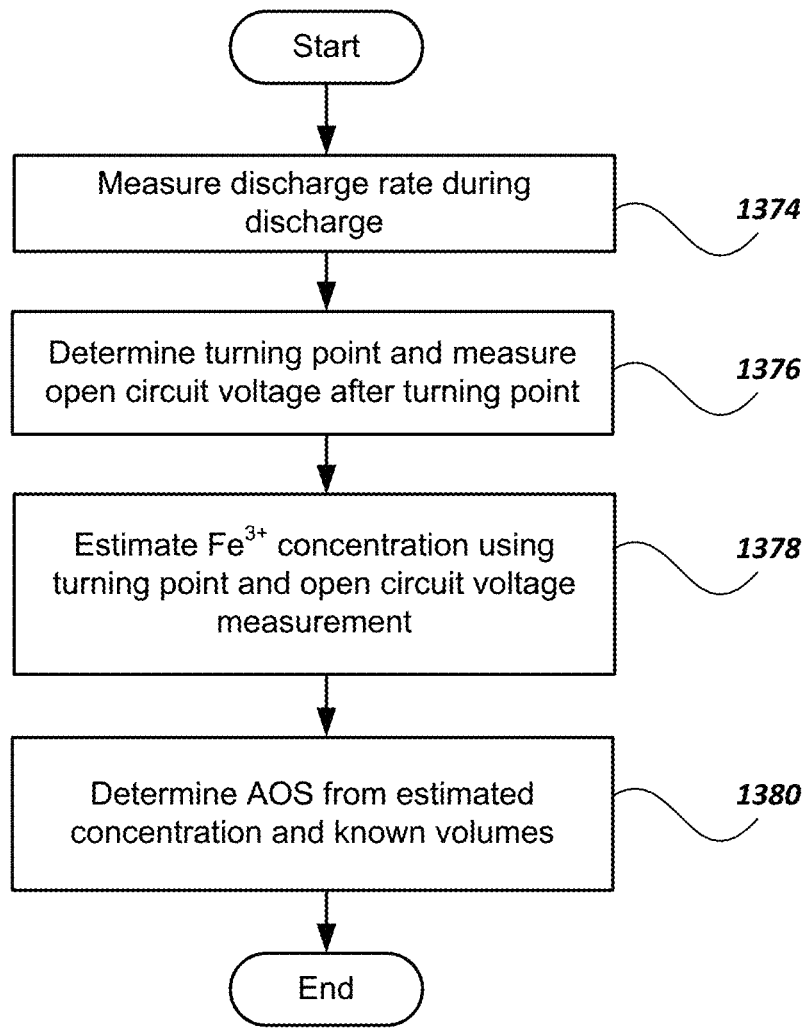
FIG. 13 is a flowchart of a third embodiment of a method of determining an average oxidation state (AOS) of a redox flow battery system, according to the invention.

In another embodiment, the discharge process, instead of the charging process, can be observed. For a charged or partly charged system, a discharge or self-discharge process can be used to estimate the extra $Fe^{3+}$ in the positive electrolyte based on the discharge rate difference between two different electrochemical pairs (here, $Fe^{2+}/Fe^{3+}$ vs $Cr^{2+}/Cr^{3+}$) and one pair with different concentrations ($Fe^{2+}/Fe^{3+}$). The change in discharge rate for the two electrochemical pairs in an electrochemical device is much faster than that of one electrochemical pair with different concentrations. As a result, as illustrated in FIG. 12 a turning point 1297 can be observed in the discharge curve 1296. In at least some embodiments, this turning point 1297 can be used to estimate the amount of extra $Fe^{3+}$ in the catholyte. FIG. 13 is one embodiment of a method of determining the AOS using the discharge curve. In step 1374, the discharge rate is measured during initial discharge. In step 1376, a turning point in the voltage discharge is determined and an open circuit voltage is measured. In step 1378, the open circuit voltage after the turning point can be used to estimate the extra concentration of the active electrochemical pair (here, $Fe^{3+}/Fe^{2+}$) using the Nernst equation. In at least some embodiments, the discharge end point is selected to be the point at which there is no more than 1%, 5%, or 10% $Cr^{2+}$ ions (of the total chromium) in the anolyte. In step 1380, the AOS can be determined from the estimated concentration, and known volumes of the electrolytes. This is the reverse process of the previously described method illustrated in FIG. 10.

In at least some embodiments, the methods of determining AOS described above and illustrated using FIGS. 9 to 13 can be performed in situ using the half-cells 106, 108, anolyte 112, catholyte 114, other elements of the redox flow battery system 100, or elements of the balance system 500. In other embodiments, the methods of determining AOS may include flowing a portion of the anolyte 112 or catholyte 114 or both into one or more other half-cells for measurements. In yet other embodiments, the methods of determining AOS can include removing portions of the anolyte 112 or catholyte 114 or both and performing measurements external to the redox flow battery system 100.

In at least some embodiments, the determined AOS can be used to estimate the amount of hydrogen generated or the production of other side products. In at least some embodiments, the determination of AOS in FIGS. 10, 11, and 13 can be followed by operation of a balancing arrangement, as described above, to rebalance the redox flow battery system and restore the AOS. Such operation can include, for example, determining an amount of the reductant 563 to add to the balancing electrolyte 562.

For a given redox flow battery system, there is a fixed ratio of the electrolyte volume inside the battery stack and the whole battery system. The electrolyte volume inside the battery stack is always much smaller than that outside the electrolyte tanks. Thus, it is much quicker to charge and discharge the electrolyte inside the stack than to charge and discharge the electrolyte in the whole system. The solution for a quick measurement for the available capacity of the redox flow battery is the charge or discharge of the electrolyte in the stack only without electrolyte flow at a given operation condition and then convert the result to the whole system based on the system design parameters.

There is often a desire to know the available energy or storage capacity, or a change in that energy or storage capacity, of a redox flow battery system. Conventional methods for such determination include, for example, taking samples from the redox flow battery system to conduct off-line titration or other analysis, in situ ultraviolet-visible (UV-Vis) measurements, or in situ potential difference measurements against a reference electrode. These methods can be slow or inaccurate.

It has been found that, during the operation of a redox flow battery system, when the active material become unbalanced, the end OCV (open circuit voltage) of the redox flow battery system for a given set of discharge conditions changes. The difference in the end OCV has a direct relationship with its usable storage or charge capacity. In addition, the end OCV can have a direct relationship with the AOS. In particular, for a given redox flow battery system, under the same discharge rate, there is a reliable relationship between the end OCV and the system storage or charge capacity or AOS. Under certain conditions, such as $H_2$ generation in the anolyte side of the system or $O_2$ intrusion into the system, the active species in the system become unbalanced. As a result, the system storage or charge capacity decreases and side reactions are further accelerated. The relationship between the OCV and the system storage or charge capacity or AOS also changes.

As an example, for one embodiment of a Fe—Cr redox flow battery system, after being charged to an OCV of 1.100V and this discharged at 33 mW/cm$^2$ to 0.60V, the discharge energy and related end OCV are given in the table below.

| End OCV (V) | 0.874 | 0.872 | 0.865 | 0.860 | 0.854 | 0.850 | 0.848 |
|---|---|---|---|---|---|---|---|
| Discharge Energy (Wh) | 890 | 900 | 926 | 949 | 968 | 986 | 1001 |

As shown in this table, the end OCV under the same discharge conditions can be used as an indicator for the available storage or charge capacity of the system. Accordingly, the end OCV can also be used as an indicator of the AOS.

Thus, in at least some embodiments, the available storage or charge capacity or the AOS can be determined by total discharge of the system under a set of given conditions, such as at a preselected discharge rate or power, followed by measurement of the end OCV. This end OCV can be compared to a pre-determined OCV curve; a pre-determined look-up table or other calibration table, chart, or the like; or applied to a pre-determined mathematical relationship to determine the storage or charge capacity or the AOS of the redox flow battery system.

In at least some embodiments, the discharge and end OCV measurement can be performed using the half-cells 106, 108 and electrodes 102, 104. In at least some embodiments, the entire redox flow battery system is discharged.

For a redox flow battery system, there is typically a fixed ratio of the electrolyte volume in the battery stack (e.g., half-cells 106, 108) and the whole system. The electrolyte volume inside the battery stack is typically much smaller than the volume in the electrolyte tanks 116, 118. Thus, it can be much quicker to charge and discharge the electrolyte inside the half-cells 106, 108 than to charge and discharge the electrolyte in the whole system. Accordingly, in at least some embodiments, flow of the electrolytes (anolyte and catholyte) may be halted during this storage capacity determination so that only the electrolyte in the half-cells 106, 108 is discharged. Typically, the end OCV measurement of the electrolytes in the half-cells 106, 108 is indicative of the entire redox flow battery system as a whole.

Figure 14:
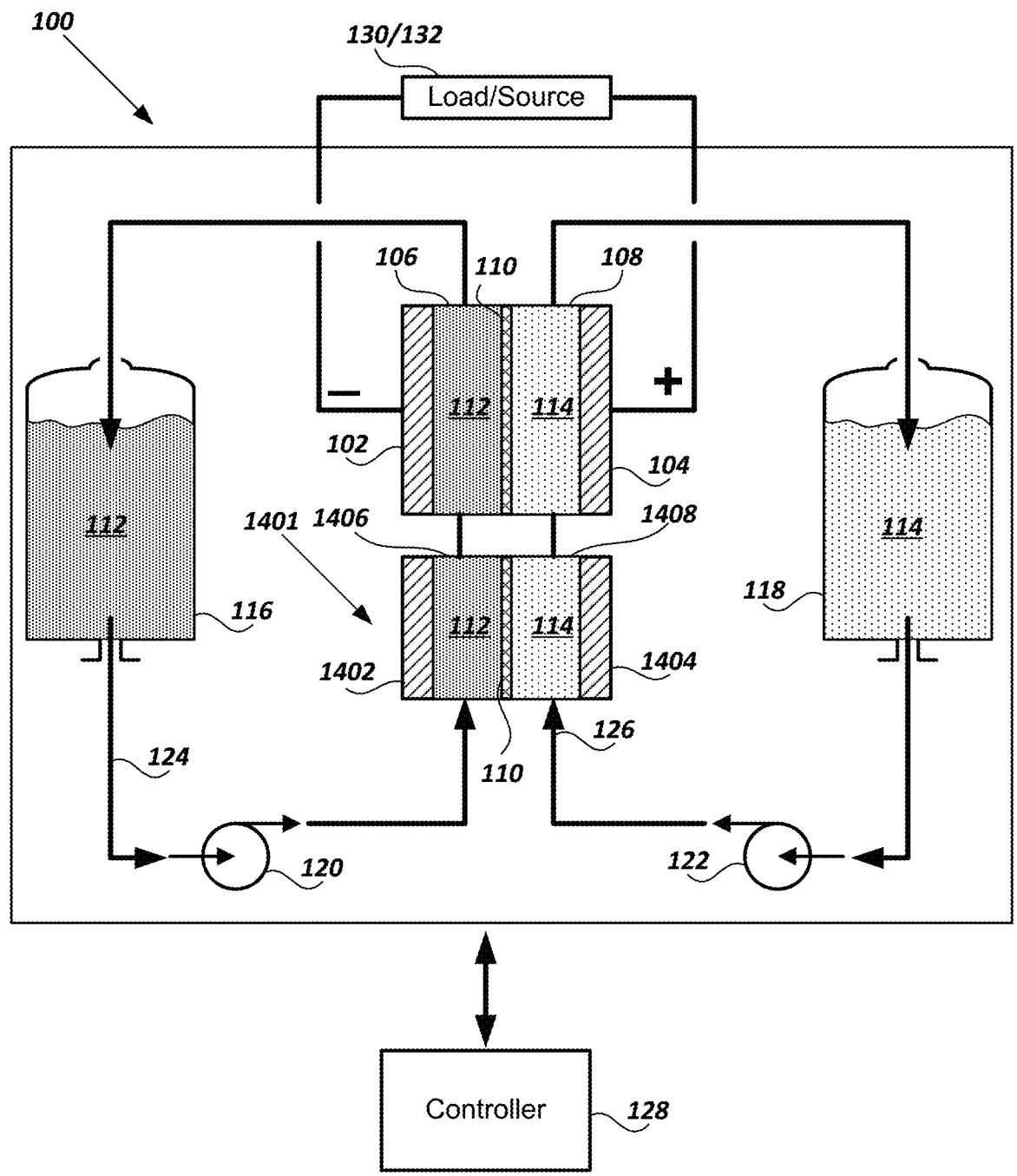
FIG. 14 is a schematic diagram of yet another embodiment of a redox flow battery system and includes a cell for measuring an open circuit voltage (OCV), according to the invention.

Moreover, it may be advantageous to use a cell with even smaller volume than the half-cells of the battery stack (for example, half-cells 106, 108) to perform the discharge and measurement of end OCV. In at least some embodiments, the redox flow battery system 100 can include an OCV cell 1401 with half-cells 1406, 1408 and electrodes 1402, 1404, as illustrated in FIG. 14. In at least some embodiments, the OCV cell 1401 may be at least 25%, 30%, 40%, 50%, 60%, or 75% smaller in volume than the half-cells 106, 108 and electrodes 102, 104. The OCV cell 1401 may be in-line with the flow of electrolytes (anolyte and catholyte) through the half-cells 106, 108, as illustrated in FIG. 14. Alternatively, the OCV cell 1401 may be positioned outside of the in-line flow of the electrolytes through the anolyte distribution arrangement 124 and catholyte distribution arrangement 126 and the OCV cell 1401 can be filled with the electrolytes using valves, switches, or the like. It may be advantageous to have a relatively small OCV cell 1401 as the discharge process in the OCV cell may be faster than in the half-cells 106, 108 (with the flow of electrolytes halted) resulting in a faster measurement of the end OCV and determination of the storage capacity. Accordingly, in at least some embodiments, flow of the electrolytes (anolyte and catholyte) may be halted during this storage capacity determination so that only the electrolyte in OCV cell 1401 is discharged.

Figure 15:
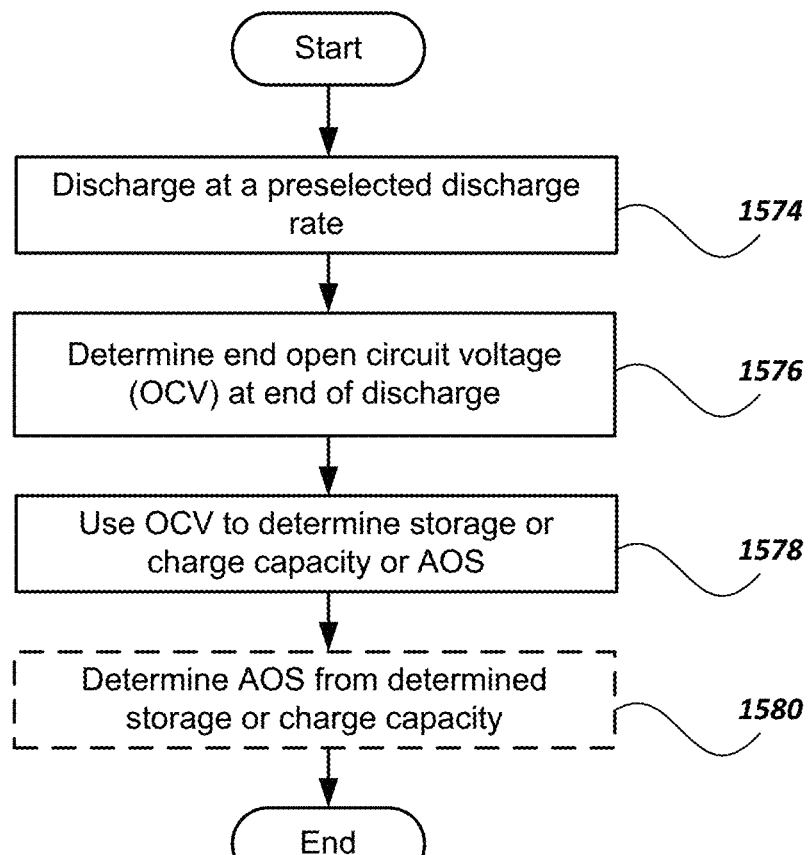
FIG. 15 is a flowchart of one method of determining storage or charge capacity by measurement of an end OCV, according to the invention.

FIG. 15 is a flowchart of one embodiment of a method of determining storage or charge capacity or AOS of a redox flow battery system. In step 1574, the redox flow battery system is discharged at a preselected discharge rate. In at least some embodiments, the actual discharge rate varies from the predetermined discharge rate by no more than 1, 5, or 10%. In at least some embodiments, the discharge is a self-discharge of the redox flow battery system. In at least some embodiments, the end discharge point is when the amount of $Cr^{2+}$ ions in the anolyte is no more than 1%, 5%, or 10% of the total chromium. Other end discharge points can be used.

In step 1576, after the discharge, the end OCV is measured. In step 1578, the measured end OCV is compared to a pre-determined OCV curve; a pre-determined look-up table or other calibration table, chart, or the like; or applied to a pre-determined mathematical relationship that relates the end OCV to concentrations of one or more active species, the storage or charge capacity, or the AOS of the redox flow battery system. In at least some embodiments, a pre-determined end OCV curve; a pre-determined look-up table or other calibration table, chart, or the like; or applied to a pre-determined mathematical relationship is obtained by experimentally measuring the end OCV, using the preselected discharge rate, of redox flow battery systems with different values of concentrations of one or more active species, storage or charge capacity, or AOS.

In optional step 1580, when the concentrations of one or more active species or the storage or charge capacity is determined in step 1578, the concentrations of one or more active species or storage or charge capacity can be used to determine the AOS using the electrolyte volumes.

In at least some embodiments, when the storage or charge capacity or AOS is determined and indicates that the system is unbalanced, any of the techniques described above can be employed to rebalance the redox flow battery system.

Figure 16:
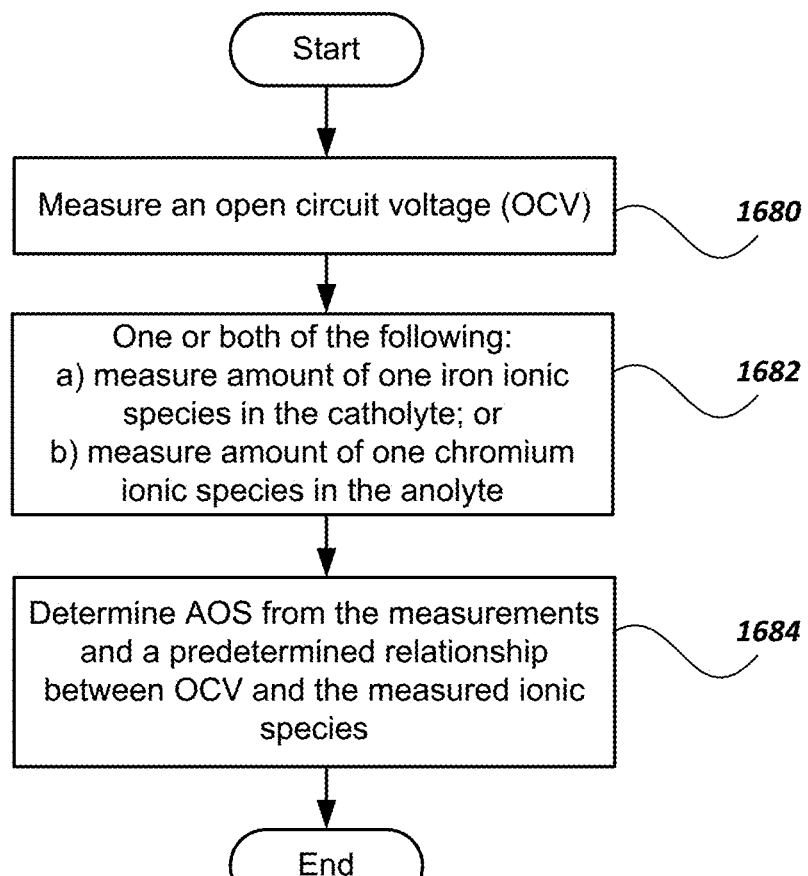
FIG. 16 is a flowchart of one method of determining AOS using a measurement of OCV, according to the invention.

AOS can also be determined using other measurements of OCV. FIG. 16 is a flowchart of one embodiment of a method of determining AOS of a redox flow battery system. In step 1680, the OCV of a redox flow battery system is measured. In step 1682, one or both of the following procedures are performed: a) an amount of one iron ionic species (for example, $Fe^{3+}$ or $Fe^{2+}$) in the catholyte is measured; or b) an amount of one chromium ionic species (for example, $Cr^{3+}$ or $Cr^{2+}$) in the anolyte is measured. It will be recognized that measurement of other ionic species in either the anolyte or catholyte (or in other types of redox flow battery systems) can be used in this step. In at least some embodiments, the two half-cells used for measurement of the amount of the one iron ionic species or the one chromium ionic species can be part of the battery stack of the redox flow battery system, such as half-cells 106, 108. In other embodiments, the two half-cells are not part of the battery stack, but can be, for example, the OCV cell 1401 of FIG. 14. In at least some embodiments, the measurement is made without electrolyte flow in the redox flow battery system. In at least some embodiments, the flow of the electrolyte that is the object of the measurement is halted while the flow of the other electrolyte is maintained to facilitate complete titration of the ionic species being measured. In at least some embodiments, the measurement of the one iron ionic species or the one chromium ionic species can utilize the balance arrangement 500 of FIG. 5A and the measurement steps can include the reduction of the one iron ionic species or the one chromium ionic species and the oxidation of vanadium ions followed by the regeneration of the vanadium ions by reducing the dioxovanadium ions using a reductant, as described above. In at least some embodiments, the measurement of the one iron ionic species or the one chromium ionic species can be performed off-line or can be performed in situ.

In step 1684, the AOS is determined using i) the measured amount of the one iron ionic species, the measured amount of the one chromium ionic species, or the measured amounts of both of the one iron ionic species and the one chromium ionic species, ii) the measured OCV, and iii) a relationship between the amount or concentration of the one iron ionic species or the one chromium ionic species in the catholyte or anolyte, respectively, and the OCV. In at least some embodiments, the AOS can be determined from a pre-determined OCV curve, look-up table, calibration table, or mathematical relationship relating OCV to one of the following: a concentration or amount of the one iron ionic species, a concentration or amount of the one chromium ionic species, or concentrations or amounts of both the one iron ionic species or the one chromium ionic species.

In at least some embodiments, the pre-determined OCV curve, look-up table, calibration table, or mathematical relationship can be a relationship between the OCV and the measured or calculated ionic species for a balanced system. The measured OCV can provide an expected concentration or amount of that ionic species. The difference between 1) the expected concentration or amount of the measured ionic species versus 2) the measured concentration or amount of the ionic species can be used to determine the AOS.

In at least some embodiments, the pre-determined OCV curve; a pre-determined look-up table or other calibration table, chart, or the like; or applied to a pre-determined mathematical relationship is obtained by experimentally measuring the OCV for different amounts or concentrations of the selected ionic species in a balanced system.

In at least some embodiments, when the AOS is determined and indicates that the system is unbalanced, any of the techniques described above can be employed to rebalance the redox flow battery system.

The above specification provides a description of the manufacture and use of the invention. Since many embodiments of the invention can be made without departing from the spirit and scope of the invention, the invention also resides in the claims hereinafter appended.

What is claimed as new and desired to be protected by Letters Patent of the United States is:

1. A method for operating a redox flow battery system comprising a catholyte and an anolyte that both comprise iron and chromium ions, the method comprising
   discharging the redox flow battery system;
   measuring a discharge rate during the discharge of the redox flow battery system;
   determining a turning point of the discharge on a discharge curve and measuring an open circuit voltage (OCV) after the turning point;
   estimating a concentration of $Fe^{3+}$ using the measured OCV; and
   determining an average oxidation state (AOS) using the estimated concentration of $Fe^{3+}$ and volumes of anolyte and catholyte of the redox flow battery system.

2. The method of claim 1, wherein a molar ratio of chromium in the anolyte to iron in the catholyte is at least 1.25.

3. The method of claim 1, further comprising rebalancing the AOS in response to the determination.

4. The method of claim 3, wherein rebalancing the AOS comprises oxidizing vanadium ions in a balancing electrolyte to dioxovanadium ions to produce hydrogen ions, wherein the anolyte or catholyte of the redox flow battery system form a balancing arrangement with the balancing electrolyte using at least two half-cells.

5. The method of claim 4, further comprising regenerating the vanadium ions by reducing the dioxovanadium ions using a reductant.

6. The method of claim 5, wherein the reductant comprises an organic compound or hydrogen gas.

7. The method of claim 5, wherein the reductant comprises a sugar, carboxylic acid, aldehyde, or alcohol.

8. The method of claim 5, wherein the reductant comprises fructose, glucose, or sucrose.

9. The method of claim 5, wherein the reductant comprises hydrogen gas.

10. The method of claim 5, wherein regenerating the vanadium ions comprises adding the reductant intermittently or periodically to the balance electrolyte.

11. The method of claim 5, wherein regenerating the vanadium ions comprises
    removing at least a portion of the balance electrolyte from the balance arrangement;
    introducing the reductant to the removed portion of the balance electrolyte; and
    returning the removed portion of the balance electrolyte to the balance arrangement.

12. The method of claim 1, wherein the redox flow battery system comprises a battery stack comprising a first half-cell and a second half-cell and the method is performed in situ using the first and second half-cells of the battery stack.

13. The method of claim 1, wherein the estimating comprises estimating the concentration of $Fe^{3+}$ based on a discharge rate difference between discharge prior to the turning point and discharge after the turning point.

14. The method of claim 1, wherein the redox flow battery system comprises
    a first half-cell comprising a first electrode in contact with the anolyte,
    a second half-cell comprising a second electrode in contact with the catholyte, and
    a first separator separating the first half-cell from the second half-cell.

15. The method of claim 14, wherein the redox flow battery system further comprises
    a balance arrangement comprising
        a balance electrolyte comprising vanadium ions in solution,
        a third half-cell comprising a third electrode in contact with the anolyte or the catholyte,
        a fourth half-cell comprising a fourth electrode in contact with the balance electrolyte, and a reductant in the balance electrolyte or introducible to the balance electrolyte for reducing dioxovanadium ions.

16. The method of claim 15, wherein the redox flow battery system further comprises an intermediate electrolyte comprising any combination of either a) $V^{3+}$ and $V^{2+}$ ions or b) $Fe^{3+}$ and $Fe^{3+}$ ions;

a fifth half-cell comprising a fifth electrode in contact with intermediate electrolyte, a second separator between the third half-cell and the fifth half-cell, a sixth half-cell comprising a sixth electrode in contact with the intermediate electrolyte, and a third separator between the fourth half-cell and the sixth half-cell.

17. The method of claim 1, further comprising estimating an amount of hydrogen generated by the redox flow battery system from the determined AOS.

18. The method of claim 1, wherein the discharging comprises self-discharging the redox flow battery system.

19. The method of claim 1, wherein the turning point represents a change from discharge utilizing both iron and chromium ions to discharge utilizing primarily only iron ions.

20. The method of claim 1, wherein the turning point represents a substantial change in the discharge rate to a lower discharge rate.

* * * * *